(12) United States Patent
Lee et al.

(10) Patent No.: US 11,437,432 B2
(45) Date of Patent: Sep. 6, 2022

(54) EMBEDDED DEVICE AND METHOD OF MANUFACTURING THE SAME

(71) Applicant: SAMSUNG ELECTRONICS CO., LTD., Suwon-si (KR)

(72) Inventors: Kilho Lee, Seoul (KR); Gwanhyeob Koh, Seoul (KR); Woojin Kim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 15 days.

(21) Appl. No.: 17/028,034

(22) Filed: Sep. 22, 2020

(65) Prior Publication Data

US 2021/0257404 A1 Aug. 19, 2021

(30) Foreign Application Priority Data

Feb. 18, 2020 (KR) .......................... 10-2020-0019519

(51) Int. Cl.
*H01L 27/22* (2006.01)
*H01L 23/522* (2006.01)
*H01L 21/768* (2006.01)
*H01L 43/12* (2006.01)

(52) U.S. Cl.
CPC ...... *H01L 27/222* (2013.01); *H01L 21/76807* (2013.01); *H01L 21/76816* (2013.01); *H01L 23/5226* (2013.01); *H01L 43/12* (2013.01)

(58) Field of Classification Search
CPC ............. H01L 27/222; H01L 21/76807; H01L 21/76816; H01L 23/5226; H01L 43/12
USPC ......................................................... 257/421
See application file for complete search history.

(56) References Cited

U.S. PATENT DOCUMENTS

| 8,865,481 | B2 | 10/2014 | Li et al. |
| 9,899,594 | B2 | 2/2018 | Kim et al. |
| 10,164,170 | B2 | 12/2018 | Suh et al. |
| 10,388,629 | B2 | 8/2019 | Kim et al. |
| 2018/0374895 | A1 | 12/2018 | Hsu et al. |
| 2019/0131346 | A1 | 5/2019 | Lin et al. |
| 2019/0324761 | A1 | 10/2019 | Choi et al. |
| 2020/0343299 | A1* | 10/2020 | Hsu ........................ H01L 43/12 |

FOREIGN PATENT DOCUMENTS

| KR | 10-2018-0065071 A | 6/2018 |
| KR | 10-2018-0110267 A | 10/2018 |
| KR | 10-2019-0122468 A | 10/2019 |

* cited by examiner

*Primary Examiner* — Tu-Tu V Ho
(74) *Attorney, Agent, or Firm* — Lee IP Law, P.C.

(57) ABSTRACT

An embedded device includes a first insulation layer, a second insulation layer on the first insulation layer, a lower electrode contact in the first insulation layer in a first region, a first structure, having a lower electrode, a magnetic tunnel junction, and an upper electrode, in the second insulation layer and contacting the lower electrode contact, a first metal wiring structure through the first and second insulation layers in a second region, a third insulation layer on the second insulation layer, a bit line structure through the third insulation layer and the second insulation layer in the first region, the bit line structure having a first height and contacting the upper electrode, and a second metal wiring structure through the third insulation layer in the second region, the second metal wiring structure contacting the first metal wiring structure, and having a second height lower than the first height.

20 Claims, 27 Drawing Sheets

EMBEDDED DEVICE AND METHOD OF MANUFACTURING THE SAME

CROSS-REFERENCE TO RELATED APPLICATION

Korean Patent Application No. 10-2020-0019519, filed on Feb. 18, 2020, in the Korean Intellectual Property Office, and entitled: "Embedded Device and Method of Manufacturing the Same," is incorporated by reference herein in its entirety.

BACKGROUND

1. Field

Example embodiments relate to a semiconductor device and a method of manufacturing the same. More particularly, example embodiments relate to an embedded device including a magnetoresistive random access memory (MRAM) device and method of manufacturing the same.

2. Description of the Related Art

An embedded device may be provided in which a magnetic tunnel junction (MTJ) module may be inserted into a back end of line (BEOL) wiring of a logic device. In this case, in order to add the MTJ module without changing a layout and/or an architecture of the logic device, a layout of the BEOL wiring may be designed.

SUMMARY

According to example embodiments, there is provided an embedded device that may include a first mold insulation layer, a second mold insulation layer, a lower electrode contact, a first structure, a first metal wiring structure, a third mold insulation layer, a bit line structure and a second metal wiring structure. The first mold insulation layer may be formed on a substrate including a first region and a second region. The second mold insulation layer may be formed on the first mold insulation layer. The lower electrode contact may be formed in the first mold insulation layer of the first region. The first structure may be formed in the second mold insulation layer of the first region. The first structure may contact an upper surface of the lower electrode contact. The first structure may include a lower electrode, a magnetic tunnel junction (MTJ) structure, and an upper electrode stacked. The first metal wiring structure may pass through the first and second mold insulation layers in the second region. The third mold insulation layer may be formed on the second mold insulation layer. The bit line structure may pass through the third mold insulation layer and an upper portion of the second mold insulation layer in the first region, the bit line structure contacting the upper electrode. The second metal wiring structure may pass through the third mold insulation layer in the second region, the second metal wiring structure may contact the first metal wiring structure. The second metal wiring structure may have a second height in a vertical direction, the bit line structure may have a first height in the vertical direction higher than the second height.

According to example embodiments, there is provided an embedded device that may include a first mold insulation layer, a second mold insulation layer, a lower electrode contact, a first structure, a first metal wiring structure, a third mold insulation layer, a bit line structure and a second metal wiring structure. The first mold insulation layer may be formed on a substrate including a first region and a second region. The second mold insulation layer may be formed on the first mold insulation layer. The lower electrode contact may be formed in the first mold insulation layer of the first region. The first structure may be formed in the second mold insulation layer of the first region. The first structure may contact an upper surface of the lower electrode contact. The first structure may include a lower electrode, a magnetic tunnel junction (MTJ) structure, and an upper electrode stacked. The first metal wiring structure may pass through the first and second mold insulation layers in the second region. The third mold insulation layer may be formed on the second mold insulation layer. The bit line structure may pass through the third mold insulation layer and an upper portion of the second mold insulation layer in the first region. The bit line structure may contact the upper electrode. The second metal wiring structure may pass through the third mold insulation layer in the second region. The second metal wiring may contact the first metal wiring structure. A height in a vertical direction of the bit line structure may be different from a height in the vertical direction of the second metal wiring structure. A shape of the bit line structure is different from a shape of the second metal wiring structure.

According to example embodiments, there is provided an embedded device that may include a substrate, a lower electrode contact, a first structure, a first metal wiring structure, a bit line structure and a second metal wiring structure. The substrate may include a first region and a second region. The lower electrode may contact on the substrate in the first region. The first structure may contact an upper surface of the lower electrode contact. The first structure may include a lower electrode, a magnetic tunnel junction (MTJ) structure, and an upper electrode stacked. The first metal wiring structure may be formed on the substrate in the second region. An upper surface the first wiring structure may be higher than an upper surface of the first structure. The bit line structure may contact the upper electrode of the first structure. The second metal wiring structure may contact the first metal wiring structure. A height in a vertical direction of the bit line structure may be different from a height in a vertical direction of the second metal wiring structure.

BRIEF DESCRIPTION OF THE DRAWINGS

Features will become apparent to those of skill in the art by describing in detail exemplary embodiments with reference to the attached drawings, in which.

DETAILED DESCRIPTION

Hereinafter, two directions parallel to a substrate and perpendicular to each other are referred to as a first direction and a second direction, respectively. An extending direction of a bit line of the embedded device is described as the second direction.

Figure 1:
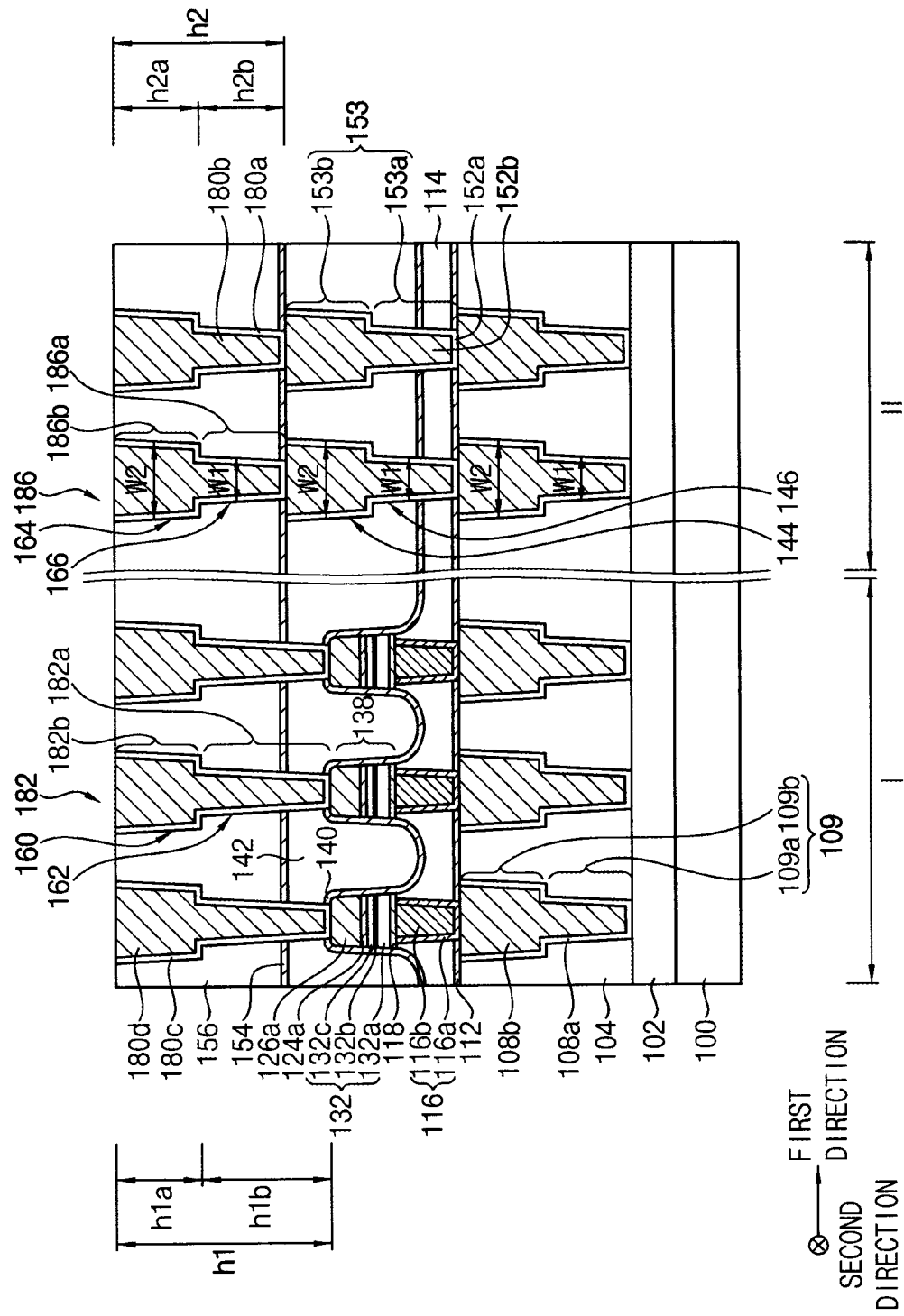
FIGS. 1 and 2 are cross-sectional views illustrating an embedded device in accordance with example embodiments.
Figure 2:
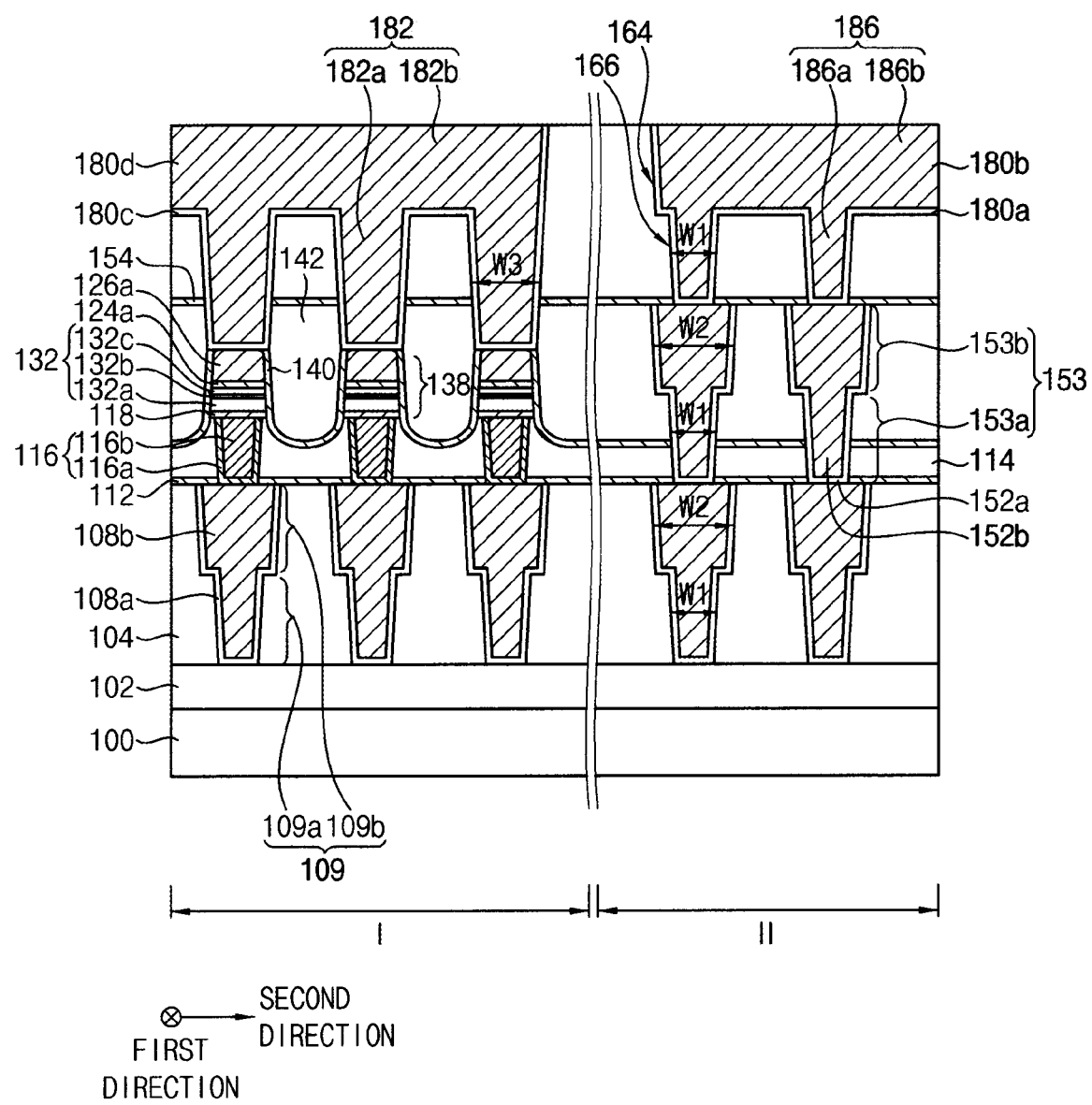
Figure 3:
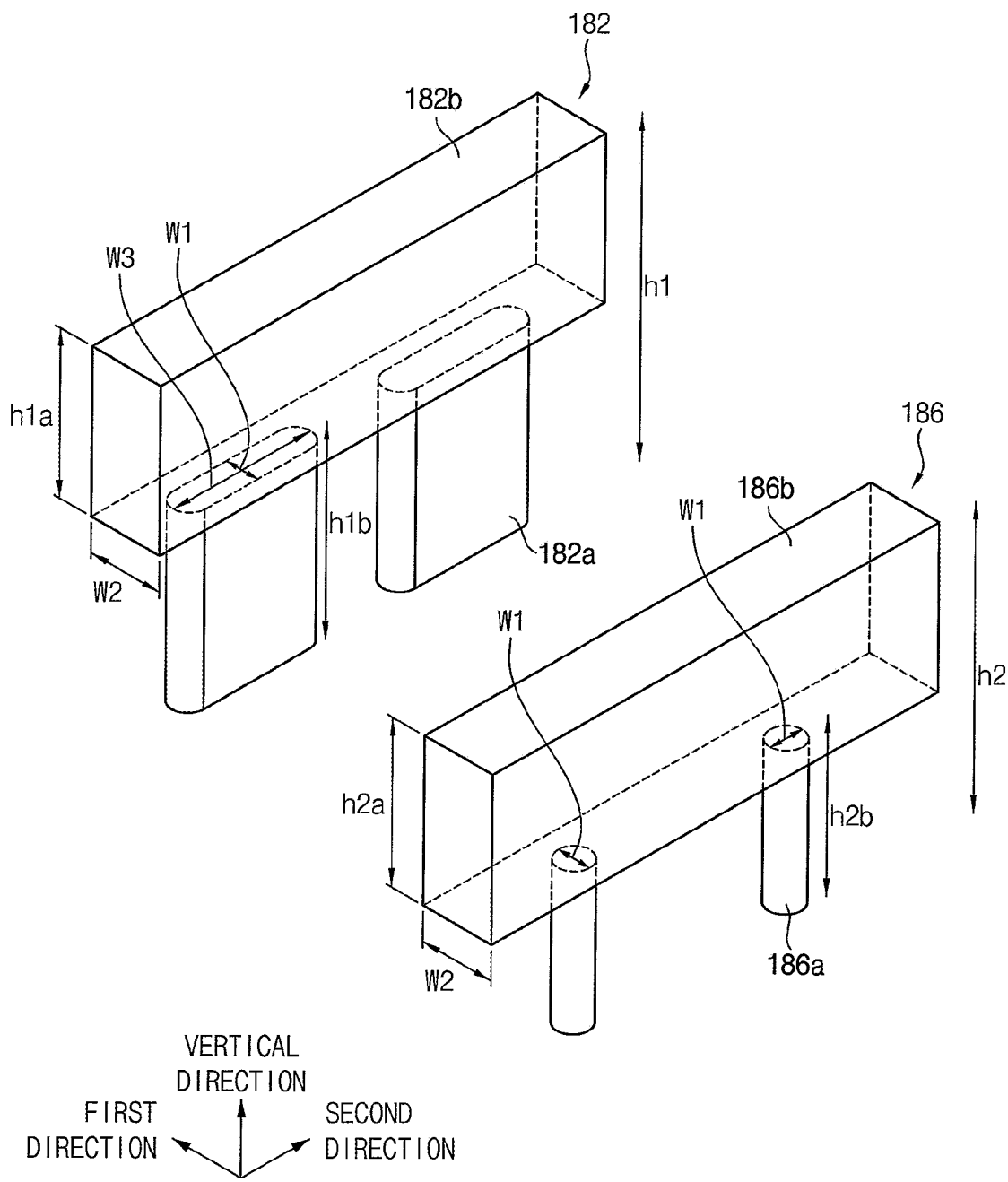
FIG. 3 is a perspective view of a bit line structure and a metal wiring structure in the embedded device of FIGS. 1-2.
Figure 4:
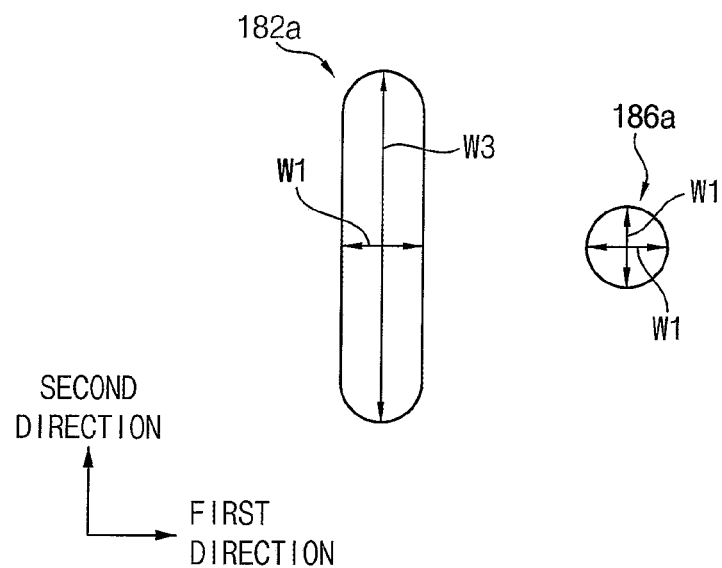
FIG. 4 is a plan view of an upper surface of the bit line structure and the metal wiring structure in the embedded device of FIGS. 1-2.
Figure 5:
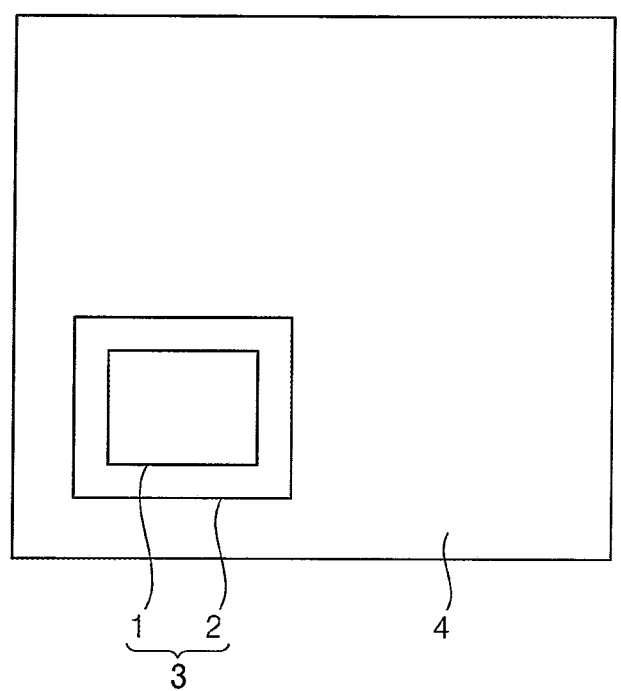
FIG. 5 is a plan view of regions of an embedded device in accordance with example embodiments.

FIGS. 1 and 2 are cross-sectional views along the first and second directions, respectively, illustrating an embedded device in accordance with example embodiments. FIG. 3 illustrates perspective views of bit line structures and metal wiring structures in the embedded device of FIGS. 1-2, respectively. FIG. 4 illustrates plan views of upper surfaces of the bit line structure and the metal wiring structure in the embedded device. FIG. 5 is a plan view of regions of an embedded device in accordance with example embodiments.

FIG. 1 is a cross-sectional view cut in the first direction, and FIG. 2 is a cross-sectional view cut in the second direction.

Referring to FIG. 5, an embedded device 10 may include a MRAM region 3 and a logic device region 4. The MRAM region 3 may include a MRAM cell region 1 and a core/peripheral region 2. Hereinafter, the MRAM cell region 1 is referred to as a first region including a MTJ module, and the logic device region 4 and core/peripheral region 2 are referred to as a second region not including the MTJ module.

Referring to FIGS. 1 and 2, circuit patterns may be formed on a substrate 100 including the first region I and the second region II. A lower insulation layer 102 may cover the circuit patterns. First lower wirings may be formed in the lower insulation layer 102.

The substrate 100 may include a group III-V compound, e.g., silicon, germanium, silicon-germanium, or GaP, GaAs, GaSb. In some example embodiments, the substrate 100 may be a silicon-on-insulator (SOI) substrate or a germanium-on-insulator (GOI) substrate.

The circuit pattern formed on the substrate 100 of the first region I may include selection devices (e.g., selection transistors) constituting memory cells. The circuit pattern formed on the substrate 100 of the second region II may include a plurality of logic transistors constituting logic circuits or peripheral circuits.

In example embodiments, the lower insulation layer 102 may include a plurality of insulating interlayers, and the first lower wirings may be formed as multi layers in the insulating interlayers. The lower insulation layer 102 may include, e.g., silicon oxide. In some example embodiments, an etch stop layer may be further formed between the insulating interlayers. The first lower wirings may include a contact plug and a conductive pattern. The first lower wirings may include, e.g., polysilicon or metal.

An upper insulation layer 104 may be formed on the lower insulation layer 102. A second lower wiring 109 may be formed in the upper insulation layer 104 on the first and second regions I and II. The second lower wiring 109 may include a contact plug 109a and a lower conductive pattern 109b on the contact plug 109a. Upper surfaces of the upper insulation layer 104 and the second lower wiring 109 may be coplanar with each other.

In example embodiments, the lower conductive pattern 109b included in the second lower wiring 109 may directly contact a lower electrode contact 116 of the MTJ module. The second lower wiring 109 may include a metal.

In example embodiments, the second lower wiring 109 may include a first barrier pattern 108a and a first conductive pattern 108b. The first barrier pattern 108a may be formed to surround sidewalls and a bottom of the first conductive pattern 108b. The first barrier pattern 108a may include, e.g., metal nitrides such as tungsten nitride, tantalum nitride, and titanium nitride, and/or metals such as tantalum and titanium. The first conductive pattern 108b may include copper.

The contact plug 109a may have a pillar shape. In example embodiments, in the cross-sectional view, the contact plug 109a may have a first width W1 in the first direction, and may have the first width W1 in the second direction. An upper surface of the contact plug 109a may be a circular shape having a diameter of the first width W1, e.g., as viewed in a top view. Hereinafter, the width in each of the first direction and the second direction may be a maximum width in each of the first direction or the second direction, in the cross-sectional view.

The lower conductive pattern 109b may have a second width W2 in the first direction greater than the first width W1. In example embodiments, the lower conductive pattern 109b may have a line shape. A vertical height of the second lower wiring 109 may be a second height h2.

As described above, the contact plug 109a may have the first width W1 in the first direction, and the lower conductive pattern 109b may have the second width W2 in the first direction. Further, the second lower wiring 109 may have the second height h2. In example embodiments, the second height h2 may be in a range of about 500 Å to about 5000 Å. A ratio of the first width W1 to the second width W2 may be about 1:1.05 to about 1:1.5. The first width W1 may be in a range of about 200 Å to about 5000 Å. Dimensions of the second lower wiring 109 may be referred to as a first design rule.

A first etch stop layer 112 and a first mold insulation layer 114 may be stacked on the upper insulation layer 104 and the second lower wiring 109 in the first region I and the second region II. The first mold insulation layer 114 may include an oxide, e.g., silicon oxide. The first etch stop layer 112 may include, e.g., silicon nitride or silicon carbonitride.

Lower electrode contacts 116 may pass through the first mold insulation layer 114 and the first etch stop layer 112 in the first region I to contact the second lower wirings 109. In example embodiments, the lower electrode contact 116 may include a barrier pattern 116a and a conductive pattern 116b.

A first structure 138 may be formed on the lower electrode contact 116. The first structure 138 may be formed on the lower electrode contact 116 and the first mold insulation layer 114 adjacent to the lower electrode contact 116. Thus, the first structure 138 may, e.g., completely, cover an upper surface of the lower electrode contact 116.

The first structure 138 may have a pillar shape in which a lower electrode 118, a MTJ structure 132, a middle electrode 124a, and an upper electrode 126a are sequentially stacked. The lower electrode contact 116 and the first structure 138 may serve as the MTJ module. For example, in some example embodiments, the middle electrode may not be included in the first structure 138.

In example embodiments, a sidewall of the first structure 138 may have a slope such that a width of the first structure 138, e.g., in the first and/or second directions, may be gradually increased toward a lower portion, i.e., toward the substrate 100. In some example embodiments, the sidewall of the first structure 138 may be vertical.

In example embodiments, an upper surface of the first mold insulation layer 114 may not be flat. The upper surface of the first mold insulation layer 114 between the first structures 138 may be lower than a bottom of the first structure 138. Thus, the upper surface of the first mold insulation layer 114 between the first structures 138 may include a recessed portion, e.g., may include a concave portion curving toward the substrate 100. In example embodiments, the upper surface of the first mold insulation layer 114 in the second region II may be lower than the upper surface of the first mold insulation layer 114 in the first region I.

The lower electrode 118 may include at least one of a metal, e.g., titanium, tantalum, or a metal nitride, e.g., titanium nitride or tantalum nitride.

The MTJ structure 132 may include a first magnetic pattern 132a, a tunnel barrier pattern 132b, and a second magnetic pattern 132c stacked.

In example embodiments, the first magnetic pattern 132a may serve as a fixed layer having a fixed magnetization direction. In example embodiments, the first magnetic pattern 132a may include a fixed pattern, a lower ferromagnetic pattern, an antiferromagnetic coupling spacer pattern, and an upper ferromagnetic pattern. In this case, the fixed pattern may include, e.g., manganese iron (FeMn), manganese iridium (IrMn), manganese platinum (PtMn), manganese oxide (MnO), manganese sulfide (MnS), tellurium manganese (MnTe), manganese fluoride (MnF$_2$), iron fluoride (FeF$_2$), iron chloride (FeCl$_2$), iron oxide (FeO), cobalt chloride (CoCl$_2$), cobalt oxide (CoO), nickel chloride (NiCl$_2$), nickel oxide (NiO), chromium (Cr), or the like. The upper and lower ferromagnetic patterns may include a ferromagnetic material, e.g., including at least one of iron (Fe), nickel (Ni), and cobalt (Co). The antiferromagnetic coupling spacer pattern may include, e.g., at least one of ruthenium (Ru), iridium (Ir), and rhodium (Rh).

In example embodiments, the second magnetic pattern 132c may serve as a free layer having a variable magnetization direction. In this case, the second magnetic pattern 132c may include ferromagnetic materials, e.g., iron (Fe), cobalt (Co), nickel (Ni), chromium (Cr), and platinum (Pt). The second magnetic pattern 132c may further include, e.g., boron (B) or silicon (Si). These may be used alone or in combination of two or more. For example, the second magnetic pattern 132c may include a composite material, e.g., CoFe, NiFe, FeCr, CoFeNi, PtCr, CoCrPt, CoFeB, NiFeSiB, CoFeSiB, or the like.

The tunnel barrier pattern 132b may be formed between the first and second magnetic patterns 132a and 132c. Thus, the first and second magnetic patterns 132a and 132c may not directly contact each other.

In example embodiments, the tunnel barrier pattern 132b may include a metal oxide having insulation properties. For example, the tunnel barrier pattern 132b may include magnesium oxide (MgO$_x$) or aluminum oxide (AlO$_x$).

The middle electrode 124a may include at least one of a metal, e.g., titanium, tantalum, or a metal nitride, e.g., titanium nitride or tantalum nitride.

The upper electrode 126a may include, e.g., tungsten, copper, platinum, nickel, silver, gold, or the like. For example, the upper electrode 126a may include tungsten.

A capping layer 140 may be conformally formed on surfaces of the first structure 138 and the first mold insulation layer 114 in the first and second regions I and II. The capping layer 140 may cover a sidewall of the first structure 138 and an upper surface of the first mold insulation layer 114. The capping layer 140 may have a substantially uniform thickness. The capping layer 140 may contact the sidewall of the first structure 138 to protect the first structure 138. The capping layer 140 may include, e.g., silicon nitride, silicon oxynitride, or the like.

The upper surface of the capping layer 140 formed on the first mold insulation layer 114 may have a recessed portion lower than the bottom of the first structure 138. That is, the recessed portion of the capping layer 140 may be formed by transferring, e.g., tracing, the recessed portion of the upper surface of the first mold insulation layer 114.

A second mold insulation layer 142 may be formed on the capping layer 140 in the first and second regions I and II. The second mold insulation layer 142 may fill a gap between the first structures 138. The second mold insulation layer 142 may include an oxide, e.g., silicon oxide.

An upper surface of the second mold insulation layer 142 may be higher than a top surface of the first structure 138. In example embodiments, a thickness, e.g., a height along a direction normal to an upper surface of the substrate, of the second mold insulation layer 142 disposed on the upper surface of the first structure 138 may be in a range of about 100 Å to about 800 Å.

In example embodiments, an upper surface of the second mold insulation layer 142 in the first and second regions I and II may be substantially flat. In some example embodiments, the upper surface of the second mold insulation layer 142 in the second region II may be lower than the upper surface of the second mold insulation layer 142 in the first region I.

A first trench 144 may be formed on a portion of the second mold insulation layer 142 of the second region II. A first via hole 146 may be communicated with a bottom of the first trench 144, e.g., the first via hole 146 may be in fluid communication with the first trench 144 to define a combined opening, and the first via hole 146 may pass through the second mold insulation layer 142 and the first etch stop layer 112 to expose the upper surface of the second lower wiring 109. The first trench 144 may have the second width W2 in the first direction, and the first via hole 146 may have the first width W1 in the first direction.

A second barrier pattern 152a and a second conductive pattern 152b may be formed in the first via hole 146 and the first trench 144.

The second barrier pattern 152a may be conformally formed on sidewalls and bottoms of the first trench 144 and the first via hole 146. The second conductive pattern 152b may be formed on the second barrier pattern 152a to fill the first via hole 146 and the first trench 144. A conductive material filling the first via hole 146 may serve as a first via contact 153a. The conductive material filling the first trench 144 may serve as a first metal wiring 153b. The second barrier pattern 152a may include at least one of the materials used to form the first barrier pattern 108a. The second conductive pattern 152b may include copper. The first via contact 153a may contact the second lower wiring 109, so that the first via contact 153a may be electrically connected to the second lower wiring 109.

The first via contact 153a and the first metal wiring 153b may serve as a first metal wiring structure 153. Upper surfaces of the second mold insulation layer 142 and the first metal wiring 153b may be substantially coplanar with each other, and the upper surfaces of the second mold insulation layer 142 and the first metal wiring 153b may have the same height in a vertical direction. Thus, a height of a structure in which the first mold insulation layer 114, the capping layer 140, and the second mold insulation layer 142 stacked may be substantially the same as a height of the first metal wiring structure 153.

The first via contact 153a may have a pillar shape. In example embodiments, an upper surface of the first via contact 153a may have the first width W1 in each of the first and second directions. The upper surface of the first via contact 153a may be a circular shape having a diameter of the first width W1.

The first metal wiring 153b may have the second width W2 in the first direction. The first metal wiring 153b may have a line shape. Further, the first metal wiring structure 153 may have the second height h2 in the vertical direction. That is, the first metal wiring structure 153 may have the first design rule.

In example embodiments, an upper surface of the MTJ module may be lower than the upper surface of the first metal wiring structure 153. A vertical height of the MTJ module may be lower than the vertical height h2 of the first metal wiring structure 153. The second mold insulation layer 142 may be formed on the MTJ module.

As described above, the MTJ module may be formed in the first mold insulation layer 114, the capping layer 140, and the second mold insulation layer 142 on the first region I. The first metal wiring structure 153 including the first via contact 153a and the first metal wiring 153b may be formed in the first mold insulation layer 114, the capping layer 140, and the second mold insulation layer 142 on the second region II.

A second etch stop layer 154 may cover the upper surfaces of the second mold insulation layer 142 and the first metal wiring structure 153 in the first and second regions I and II. A third mold insulation layer 156 may be stacked on the second etch stop layer 154.

The third mold insulation layer 156 may include an oxide, e.g., silicon oxide. The second etch stop layer 154 may include, e.g., silicon nitride, silicon carbide nitride, or the like. An upper surface of the third mold insulation layer 156 in the first and second regions I and II may be substantially flat.

A second trench 164 may be formed on a portion of the third mold insulation layer 156 in the second region II. Further, a second via hole 166 may be communicated with a bottom of the second trench 164, and the second via hole 166 may pass through the third mold insulation layer 156 and the second etch stop layer 154 to expose an upper surface of the first metal wiring 153b.

The second trench 164 may have the second width W2 in the first direction. The second via hole 166 may have the first width W1 in each of the first and second directions. The second trench 164 may extend in the second direction.

A third barrier pattern 180a and a third conductive pattern 180b may be formed in the second via hole 166 and the second trench 164. The third barrier pattern 180a may be conformally formed on sidewalls and bottoms of the second trench 164 and the second via hole 166. The third conductive pattern 180b may be formed to fill the second via hole 166 and the second trench 164 on the third barrier pattern 180a. A metal material filling the second via hole 166 may serve as a second via contact 186a. A metal material filling the second trench 164 may serve as a second metal wiring 186b.

The second via contact 186a and the second metal wiring 186b may serve as a second metal wiring structure 186. The second via contact 186a may contact the first metal wiring 153b, so that the second via contact 186a may be electrically connected to the first metal wiring 153b. The first and second metal wiring structures 153 and 186 may be electrically connected to each other.

In FIGS. 3 and 4, the second via contact 186a is shown on the right.

Referring to FIGS. 3 and 4, an upper surface of the second via contact 186a may have the first width W1 in each of the first and second directions. That is, the upper surface of the second via contact 186a may have a circular shape with a diameter of the first width W1. The second via contact 186a may have a pillar shape, e.g., a circular cylinder shape with a longitudinal direction along the vertical direction.

The second metal wiring 186b may have the second width W2 in the first direction. For example, as illustrated in FIG. 3, the second metal wiring 186b may have a rectangular prism shape with a longitudinal direction along the second direction, the second width W2 along the first direction, and a second upper height h2a along the vertical direction, e.g., the second metal wiring 186b may extend continuously along the second direction to be connected to multiple second via contacts 186a. For example, as illustrated in FIG. 3, the second width W2 may be larger than the first width W1 in the first direction, e.g., a bottom of the second metal wiring 186b may completely overlap and extend beyond the second via contact 186a in the first and second directions.

The second metal wiring structure 186 may have the second height h2 in the vertical direction. That is, the second metal wiring structure 186 may have the first design rule. The second via contact 186a may have a second lower height h2b in the vertical direction, and the second metal wiring 186b may have the second upper height h2a in the vertical direction, i.e., the second height h2 may equal the sum of the second upper and lower heights h2a and h2b.

A third trench 160 may be formed on a portion of the third mold insulation layer 156 in the first region I. Further, a bit line contact hole 162 may be communicated with a bottom of the third trench 160, and the bit line contact hole 162 may pass through the third mold insulation layer 156, the second etch stop layer 154, the second mold insulation layer 142 and the capping layer 140 to expose an upper surface of the upper electrode 126a.

The third trench 160 may have the second width W2 in the first direction. The bit line contact hole 162 may have the first width W1 in the first direction, and a third width W3 greater than the first width W1 in the second direction.

A fourth barrier pattern 180c and a fourth conductive pattern 180d may be formed in the bit line contact hole 162 and the third trench 160. The fourth barrier pattern 180c may be conformally formed on sidewalls and bottoms of the third trench 160 and the bit line contact hole 162. The fourth conductive pattern 180d may be formed to fill the bit line contact hole 162 and the third trench 160 on the fourth barrier pattern 180c. The conductive material filling the bit line contact hole 162 may serve as a bit line contact 182a. The conductive material filling the third trench 160 may serve as a bit line 182b. The bit line contact 182a and the bit line 182b may serve as a bit line structure 182. The upper surfaces of the third mold insulation layer 156, the second metal wiring structure 186, and the bit line structure 182 may be coplanar with each other.

As the fourth barrier pattern 180c and the third barrier pattern 180a are formed by the same process, the fourth barrier pattern 180c and the third barrier pattern 180a may include the same material. As the fourth conductive pattern 180d and the third conductive pattern 180b are formed by the same process, the fourth conductive pattern 180d and the third conductive pattern 180b may include the same material. For example, the fourth conductive pattern 180d may include copper.

The bit line contact 182a may contact the upper electrode 126a, so that the bit line contact 182a may be electrically connected to the upper electrode 126a.

In FIGS. 3 and 4, the bit line contact 182a is shown on the left.

Referring to FIGS. 3 and 4, an upper surface of the bit line contact 182a may have the first width W1 in the first direction, and the third width W3 in the second direction. That is, an upper surface of the bit line contact 182a may have an elliptical shape having a longer length in the second direction. The bit line contact 182a may have a pillar shape, e.g., an elliptical cylinder shape with a longitudinal direction along the vertical direction.

The bit line 182b may extend in the second direction. The bit line 182b may have the second width W2 in the first direction. For example, as illustrated in FIG. 3, the bit line 182b may have a rectangular prism shape with a longitudinal direction along the second direction, the second width W2 along the first direction, and a first upper height h1a along the vertical direction, e.g., the bit line 182b may extend continuously along the second direction to be connected to multiple bit line contacts 182a.

The bit line structure 182 may have a first height h1 in the vertical direction. The first height h1 may be higher than the second height h2, e.g., a total first height h1 may be larger than a total second height h2. The bit line contact 182a may have a first lower height h1b, and the bit line 182b may have the first upper height h1a. The first lower height h1b of the bit line contact 182a may be higher than the second lower height h2b of the second via contact 186a, e.g., a total first lower height h1b may be larger than a total second lower height h2b. Further, a bottom of the bit line structure 182 may be lower than a bottom of the second metal wiring structure 186, e.g., a distance between the bottom of the bit line structure 182 and a top of the substrate 100 may be smaller than a distance between the bottom of the second metal wiring structure 186 and the top of the substrate 100 (FIGS. 1-2).

As described above, the bit line structure 182 may have a shape different from a shape of the second metal wiring structure 186 when viewed at the same level, e.g., different shapes of top surfaces of the bit line contact 182a and the second via contact 186a. Also, the bit line structure 182 may have a height different from a height of the second metal wiring structure 186, e.g., different heights of the bit line contact 182a and the second via contact 186a along the vertical direction. The bit line contact 182a may have a shape different from a shape of the second via contact 186a. Particularly, a height of the bit line contact 182a may be higher than a height of the second via contact 186a. A bottom of the bit line contact 182a may be lower than a bottom surface of the second via contact 186a. In this case, the bit line contact 182a may have a width in the second direction greater than a width of the second via contact 186a. That is, a volume of the bit line contact 182a may be larger than a volume of the second via contact 186a.

When the bit line contact 182a and the second via contact 186a are formed at the same time, a metal material may easily fill the bit line contact hole 162 (i.e., a larger hole accommodating a larger contact volume). Thus, defects of the bit line contact 182a may be decreased.

As described above, as the height of the bit line contact 182a is larger than a height of the second via contact 186a (and extend lower), an upper surface of the MTJ module (i.e., below the bit line contact 182a) may be lower than an upper surface of the first metal wiring structure 153 (i.e., below the second via contact 186a). Therefore, the MTJ module may be disposed within a height of a portion at which the first metal wiring structure 153 is formed. Thus, even if the MTJ module is formed, it may not change the layout of the wiring structures.

Further, a stacked structure including the MTJ module and the bit line structure 182 may be disposed within heights of portions at which the first and second metal wiring structures 153 and 186 are stacked. Thus, even if the bit line 182b is formed, it may not be necessary to change the layout of the wiring structures. Thus, while minimizing changes in processes for forming a logic device (e.g., a wiring process of the logic structure), the MTJ module and the bit line structure 182 may be formed in the first region I.

FIGS. 6 to 18 are cross-sectional views illustrating stages in a method of manufacturing an embedded device in accordance with example embodiments.

Figure 6:
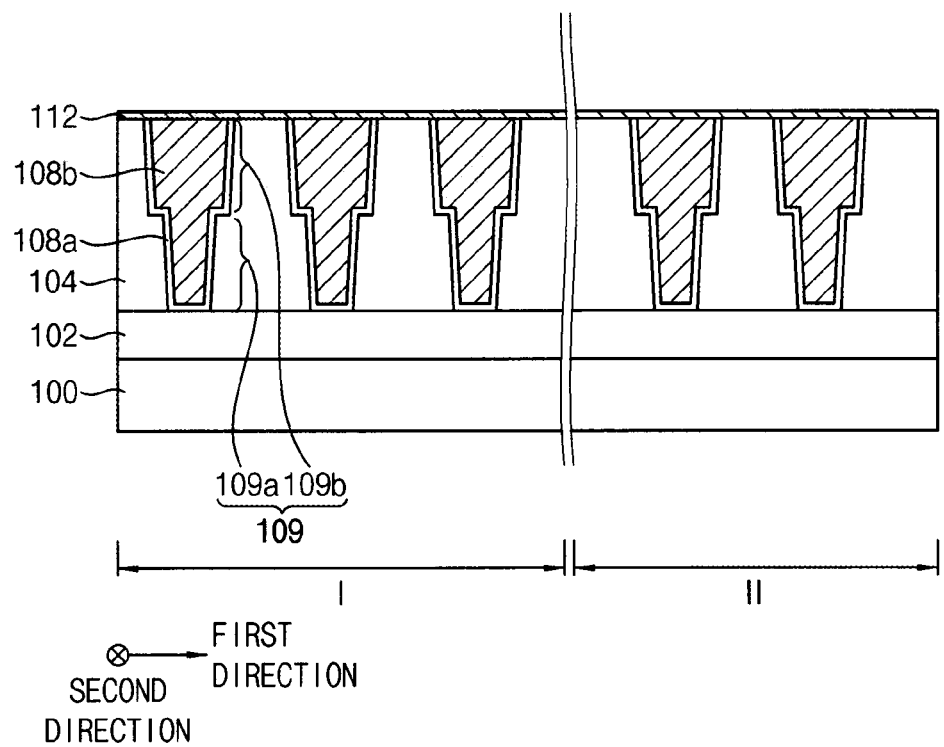
FIGS. 6 to 18 are cross-sectional views illustrating stages in a method of manufacturing an embedded device in accordance with example embodiments.

Referring to FIG. 6, a selection device included in a memory cell may be formed on the substrate 100 of the first region I. A plurality of logic transistors included in logic circuits or a peripheral circuit may be formed on the substrate 100 of the second region II.

The lower insulation layer 102 may be formed on the substrate 100 of the first and second regions I and II to cover the selection device and the logic transistors. A first lower wiring including a contact plug and a conductive pattern may be further formed in the lower insulation layer 102.

The upper insulation layer 104 may be formed on the lower insulation layer 102. The second lower wiring 109 including the contact plug 109a and the lower conductive pattern 109b may be formed in the upper insulation layer 104 on the first and second regions I and II.

In example embodiments, the contact plug 109a and the lower conductive pattern 109b may be formed by a damascene process. For example, a portion of the upper insulation layer 104 may be etched to form a trench and a via hole. The via hole may be communicated with the trench, and may expose a conductive pattern of the first lower wiring. An order for forming the trench and the via hole may not be limited. That is, first, the trench may be formed. Otherwise, first, the via hole may be formed. A first barrier layer and a first metal layer may be formed on the trench, the via hole and the upper insulation layer 104. The first barrier layer and the first metal layer may be planarized until an upper surface of the upper insulation layer 104 may be exposed to form the second lower wiring 109. The second lower wiring 109 may include the first barrier pattern 108a and the first conductive pattern 108b.

The first etch stop layer 112 may be formed on the upper insulation layer 104 and the second lower wiring 109 in the first and second regions I and II.

Figure 7:
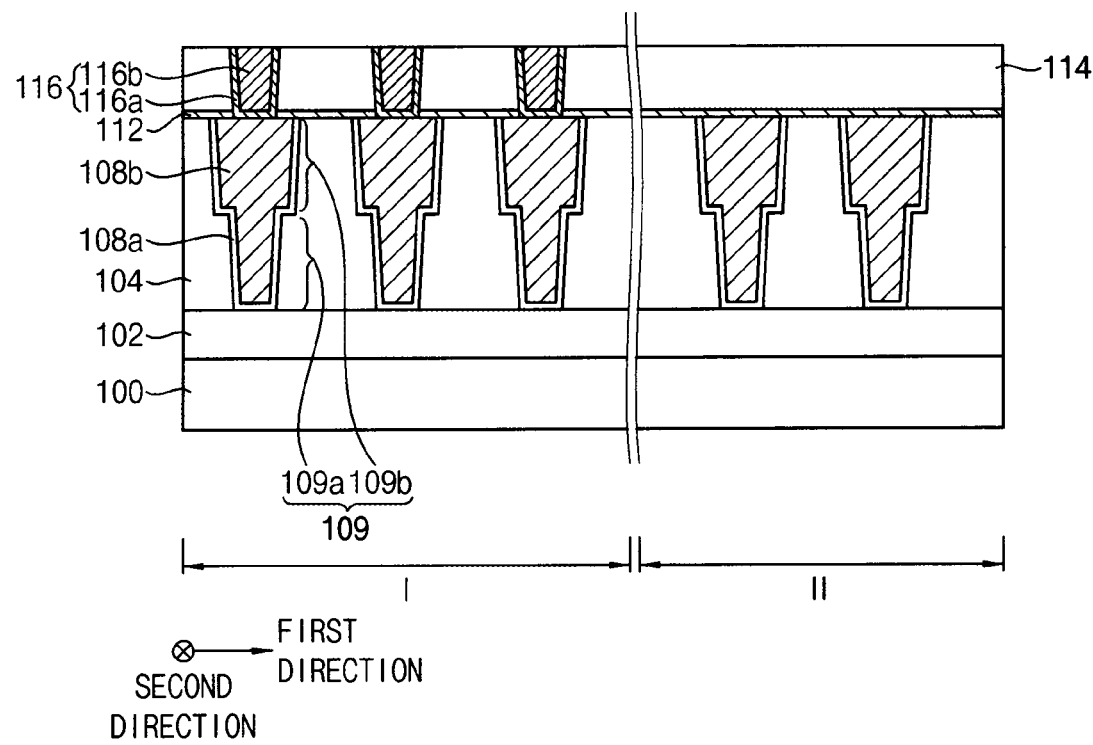

Referring to FIG. 7, the first mold insulation layer 114 may be formed on the first etch stop layer 112. The first mold insulation layer 114 and the first etch stop layer 112 in the first region I may be etched to form a lower electrode contact hole passing through the first mold insulation layer 114 and the first etch stop layer 112. The lower electrode contact 116 may be formed in the lower electrode contact hole. The lower electrode contact 116 may contact the second lower wiring 109 in the first region I.

Figure 8:
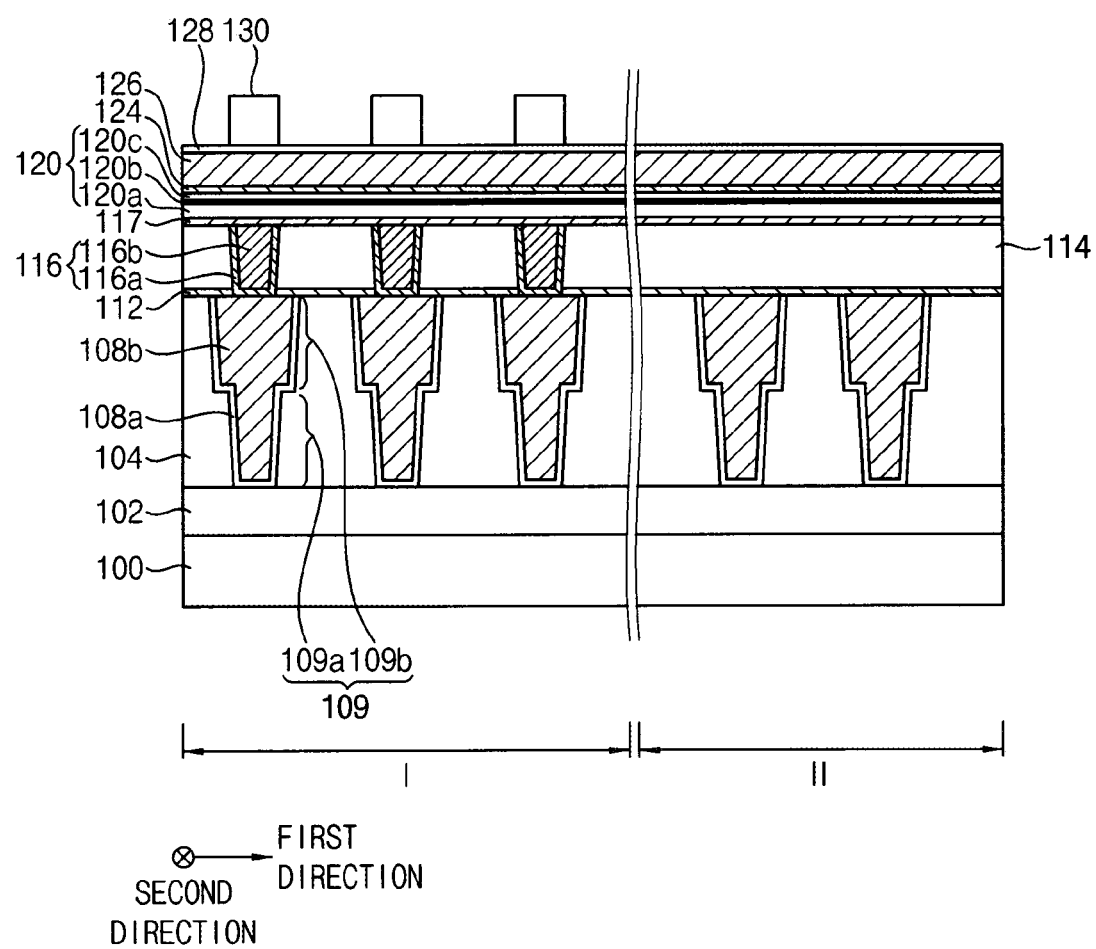

Referring to FIG. 8, a lower electrode layer 117, a MTJ layer 120, and a middle electrode layer 124 may be sequentially formed on the first mold insulation layer 114 and the lower electrode contact 116. An upper electrode layer 126 and an adhesive layer 128 may be sequentially formed on the middle electrode layer 124. A mask pattern 130 may be formed on the adhesive layer 128.

The MTJ layer 120 may include a first magnetic layer 120*a*, a tunnel barrier layer 120*b*, and a second magnetic layer 120*c* stacked. In some example embodiments, the middle electrode layer 124 may not be formed.

The adhesive layer 128 may be formed to easily attach the mask pattern 130 thereon. In example embodiments, the adhesive layer 128 may include nitride, e.g., silicon nitride, silicon oxynitride, or the like.

The mask pattern 130 may be disposed to face the lower electrode contact 116. The mask pattern 130 may be formed only on the first region I, and the mask pattern 130 may not be formed on the second region II. The mask pattern 130 may have a pillar shape. In example embodiments, a plurality of mask patterns 130 may be regularly arranged. In example embodiments, the mask pattern 130 may include, e.g., silicon oxide.

Figure 9:
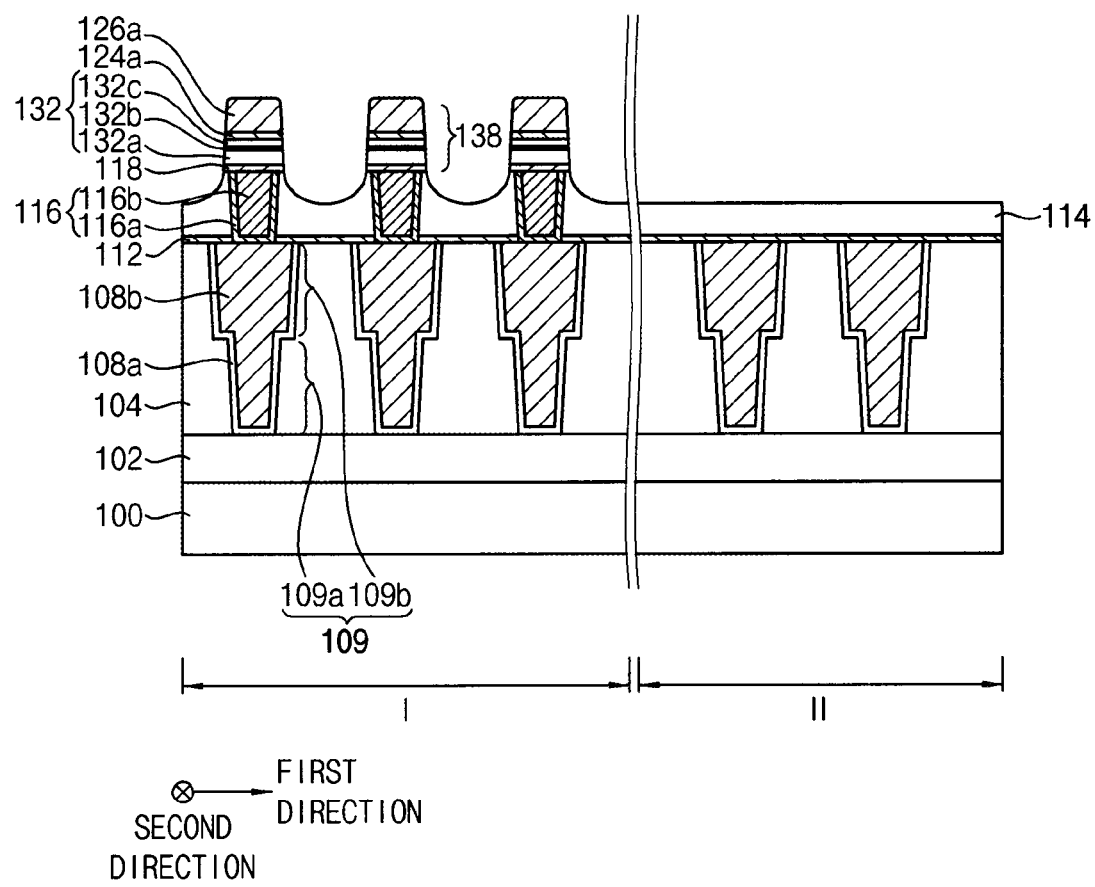

Referring to FIG. 9, the adhesive layer 128 and the upper electrode layer 126 may be anisotropically etched using the mask pattern 130 as an etch mask. The anisotropic etching process may include a reactive ion etching (ME) process. When the etching process is performed, the upper electrode 126*a* and an adhesive layer pattern may be formed on the middle electrode layer 124.

The middle electrode layer 124, the MTJ layer 120, and the lower electrode layer 117 may be sequentially etched using a structure in which the upper electrode 126*a*, the adhesive layer pattern, and the mask pattern 130 are stacked as an etch mask. Further, an upper portion of the first mold insulation layer 114 may be partially etched.

Thus, the first structure 138 including a stack of the lower electrode 118, the MTJ structure 132, the middle electrode 124*a*, and the upper electrode 126*a* may be formed on the first mold insulation layer 114. A recess may be formed on an upper surface of the first mold insulation layer 114 between the first structures 138.

In example embodiments, in the etching process, an etch rate of the first mold insulation layer 114 having no mask pattern 130 in the second region II may be higher than an etch rate of the first mold insulation layer 114 in the first region I. Thus, an upper surface of the first mold insulation layer 114 in the second region II may be lower than an upper surface of the first mold insulation layer 114 in the first region I.

In the etching process, the mask pattern 130 and the adhesive layer pattern may be removed. In example embodiments, an upper portion of the upper electrode 126*a* may be partially etched.

Figure 10:
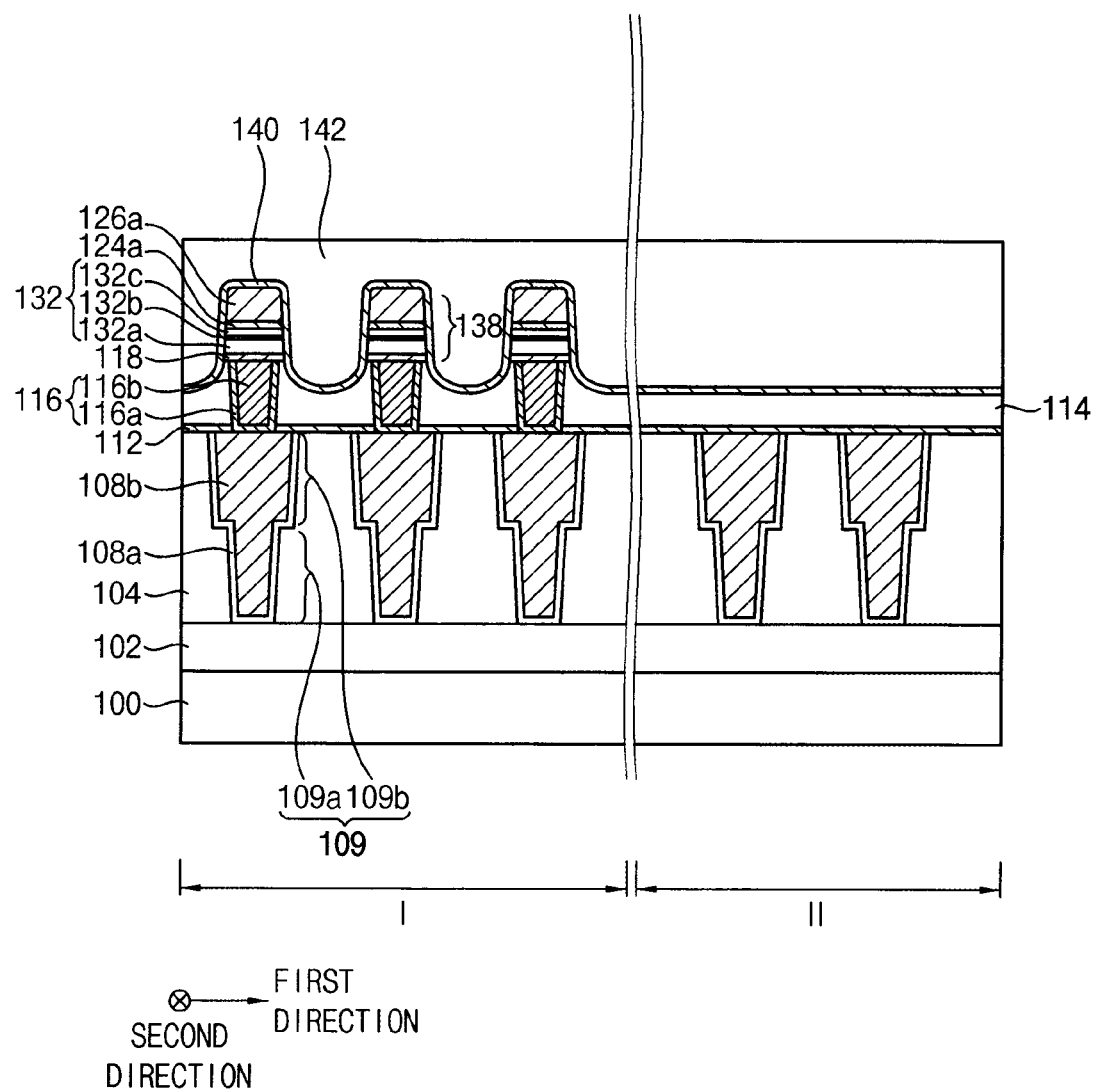

Referring to FIG. 10, a capping layer 140 may be conformally formed on surfaces of the first structure 138 and the first mold insulation layer 114. A second mold insulation layer 142 may be formed on the capping layer 140.

The capping layer 140 may cover upper surfaces of the first structure 138 and the first mold insulation layer 114. The capping layer 140 may be formed to have a uniform thickness. In example embodiments, the capping layer 140 may be formed by an atomic layer deposition process or a chemical vapor deposition process.

In example embodiments, an upper surface of the capping layer 140 formed on the first mold insulation layer 114 may be lower than a bottom of the first structure 138, and thus the upper surface of the capping layer 140 formed on the first mold insulation layer 114 may have a recessed portion. In some example embodiments, the upper surface of the capping layer 140 in the second region II may be substantially the same as or lower than the capping layer 140 formed on the first mold insulation layer 114 in the first region I.

The second mold insulation layer 142 may be formed to fill a gap between the first structures 138.

A portion of the second mold insulation layer 142 may be consumed during a subsequent polishing process. In this case, e.g., when the upper surface of the first structure 138 is exposed, defects may occur. Therefore, the second mold insulation layer 142 may be formed to sufficiently cover the first structure 138 so that the defects may not occur. In example embodiments, the upper surface of the second mold insulation layer 142 may be higher than a top surface of the first structure 138. In example embodiments, a thickness of the second mold insulation layer 142 disposed on the top surface of the first structure 138 may be in a range of about 100 Å to about 800 Å.

In example embodiments, an upper surface of the second mold insulation layer 142 in the first and second regions I and II may be substantially flat. In some example embodiments, an upper surface of the second mold insulation layer 142 in the first region I may be higher than an upper surface of the second mold insulation layer 142 in the second region II.

Figure 11:
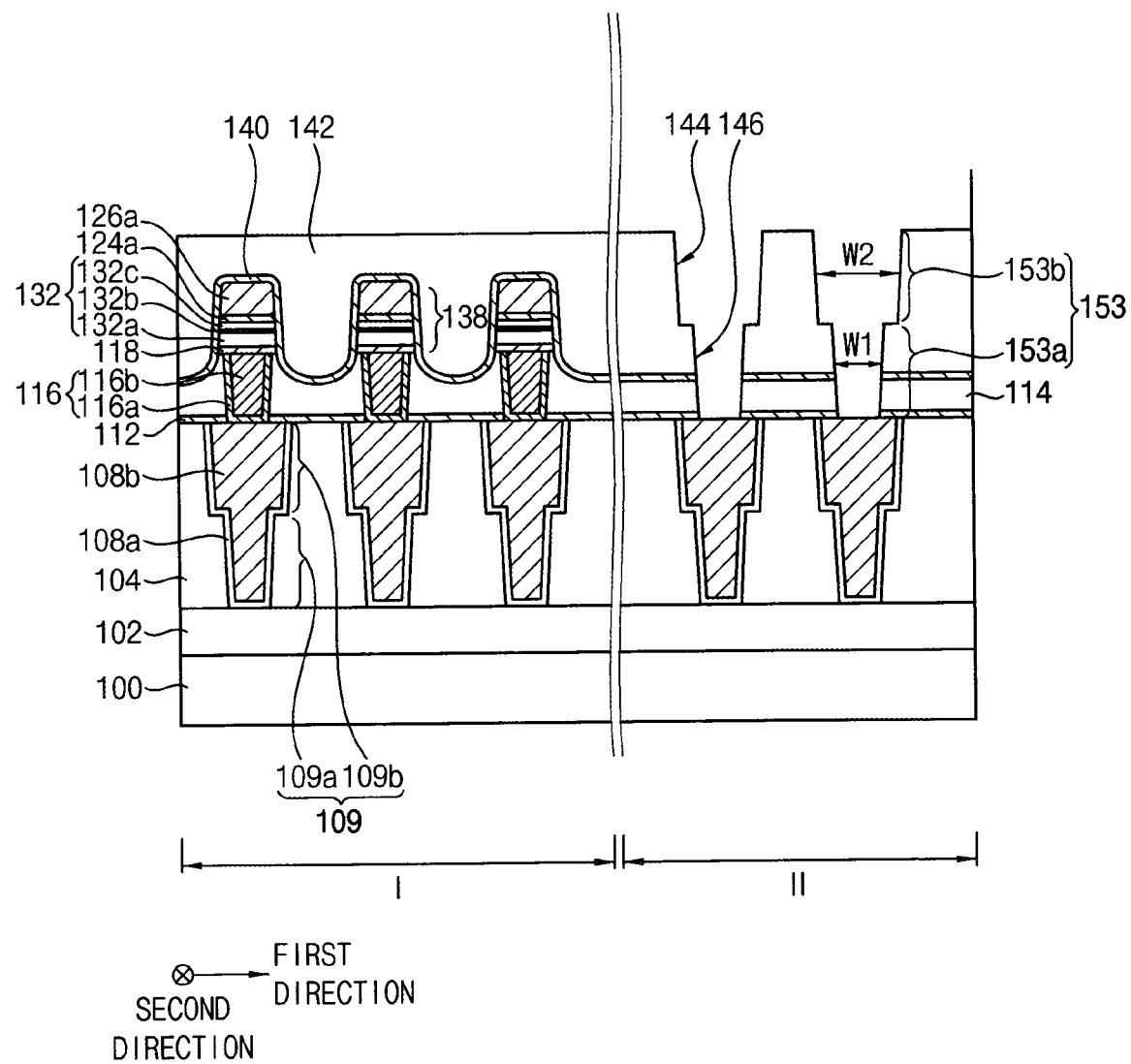

Referring to FIG. 11, the first trench 144 may be formed on an upper portion of the second mold insulation layer 142 in the second region II. The first via hole 146 may be formed to pass through the second mold insulation layer 142, the capping layer 140, the first mold insulation layer 114, and the first etch stop layer 112 formed below the first trench 144.

In example embodiments, the upper portion of the second mold insulation layer 142 in the second region II may be partially etched to form the first trench 144 extending in one direction. The first trench 144 may have the second width W2 in the first direction.

An etch mask exposing a portion of the first trench 144 may be formed on the second mold insulation layer 142. The second mold insulation layer 142, the capping layer 140, the first mold insulation layer 114, and the first etch stop layer 112 formed below the first trench 144 may be sequentially etched using the etch mask to form the first via hole 146. The first via hole 146 may have the first width W1 in each of the first direction and the second direction. As described above, first, the first trench 144 may be formed. Otherwise, first, the first via hole 146 may be formed, and then the first trench 144 may be formed.

Figure 12:
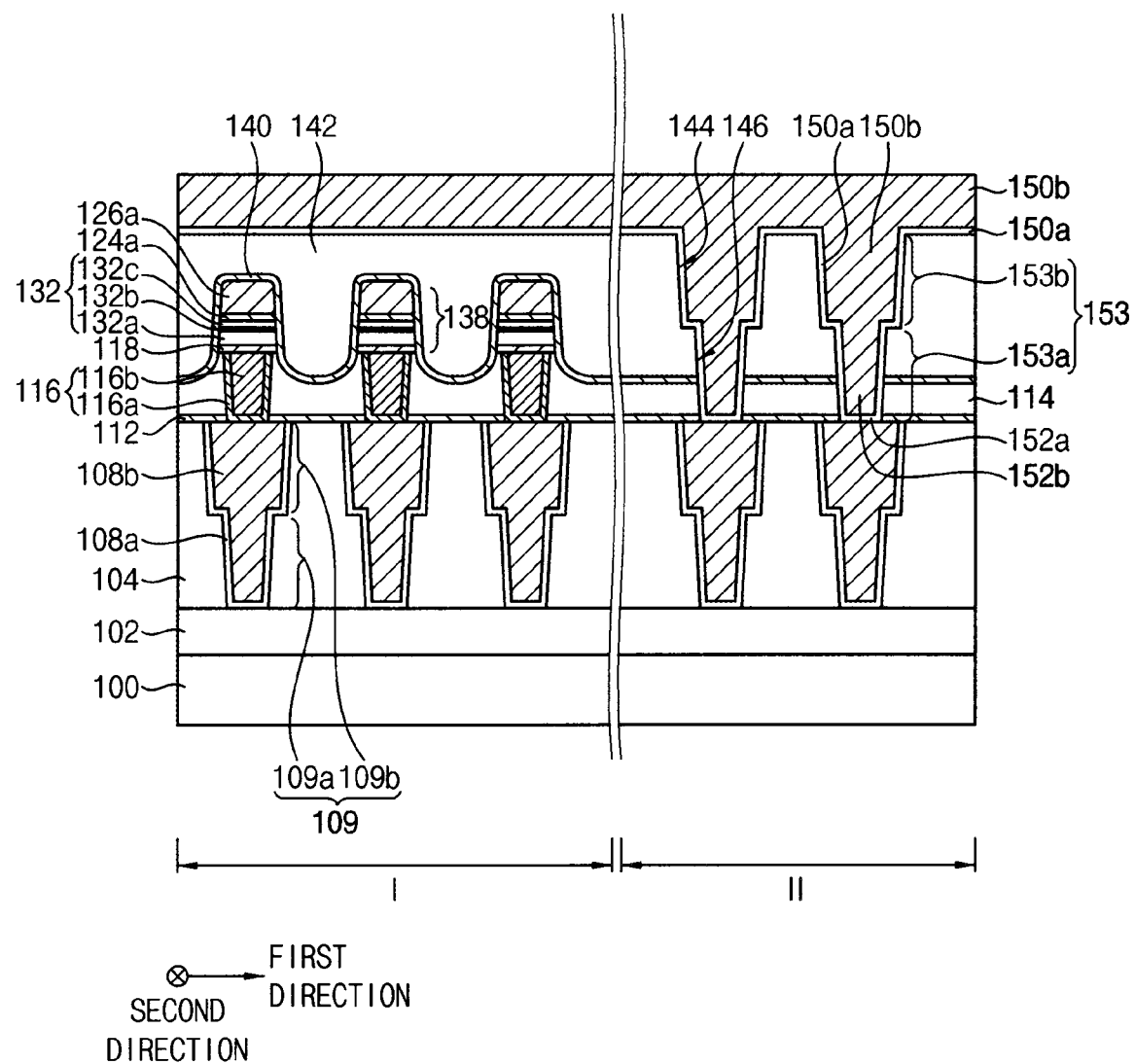

Referring to FIG. 12, a second barrier layer 150*a* may be conformally formed on surfaces of the first trench 144 and the first via hole 146 and the upper surface of the second mold insulation layer 142. A second conductive layer 150*b* may be formed on the second barrier layer 150*a* to fill the first trench 144 and the first via hole 146.

Figure 13:
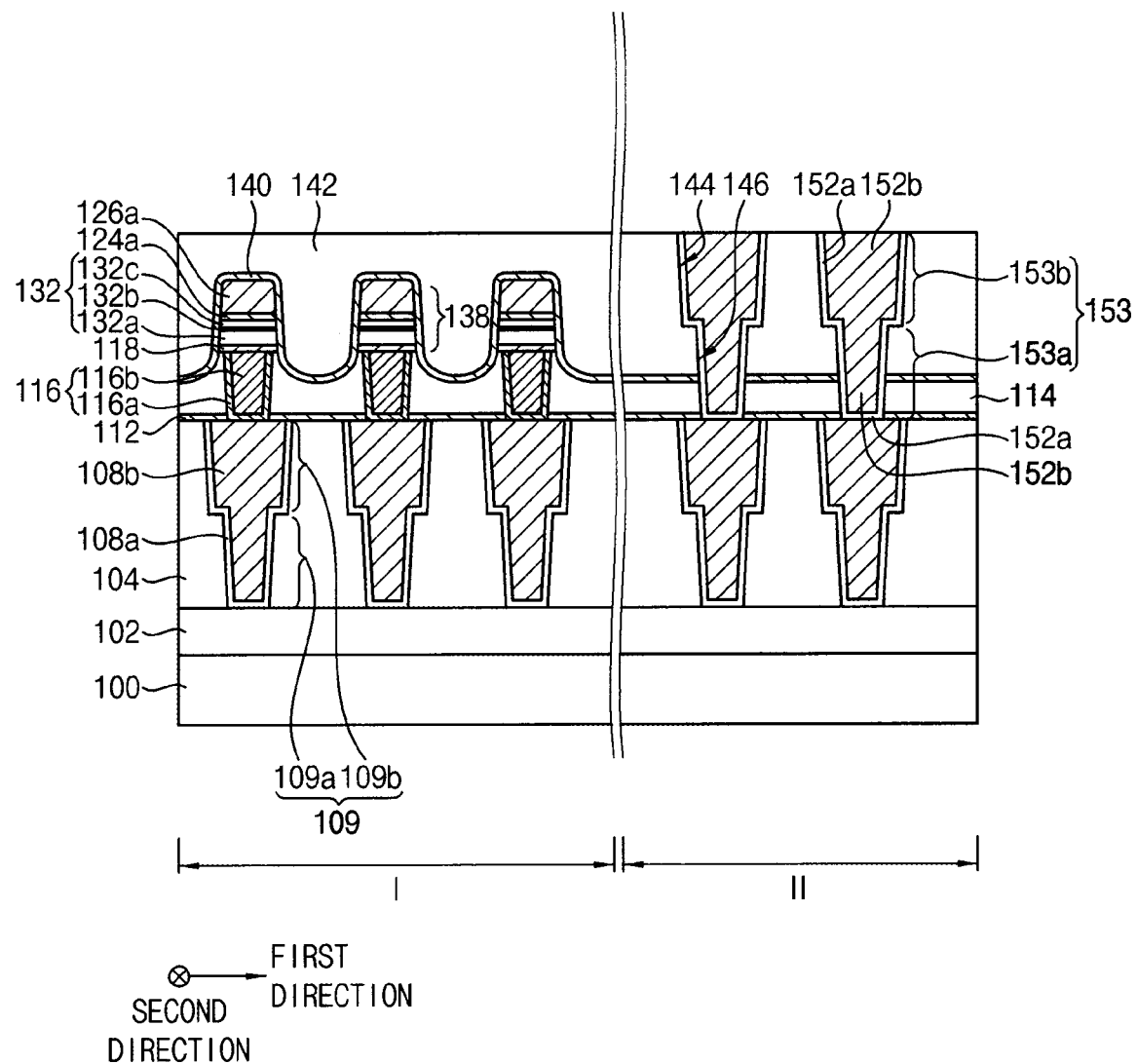

Referring to FIG. 13, upper surfaces of the second conductive layer 150*b* and the second barrier layer 150*a* may be planarized until the upper surface of the second mold insulation layer 142 may be exposed to form a second barrier pattern 152*a* and the second conductive pattern 152*b* filling the first trench 144 and the first via hole 146.

The planarization process may include a chemical mechanical polishing (CMP) process. After performing the CMP process, the upper electrode 126*a* in the first region I may not be exposed. In example embodiments, in the first region, the upper surface of the second mold insulation layer 142 may be only exposed. For example, a thickness of the second mold insulation layer 142 disposed on the top surface of the first structure 138 may be in a range of about 100 Å to about 800 Å.

In some example embodiments, in the first region I, the upper surface of the second mold insulation layer 142 and a portion of the capping layer 140 may be exposed.

By the above process, the first via contact 153a may be formed to fill the first via hole 146, and the first metal wiring 153b may be formed to fill the first trench 144. The first via contact 153a and the first metal wiring 153b may serve as the first metal wiring structure 153. A vertical height of the first metal wiring structure 153 may be in a range of about 500 Å to about 5000 Å.

Figure 14:
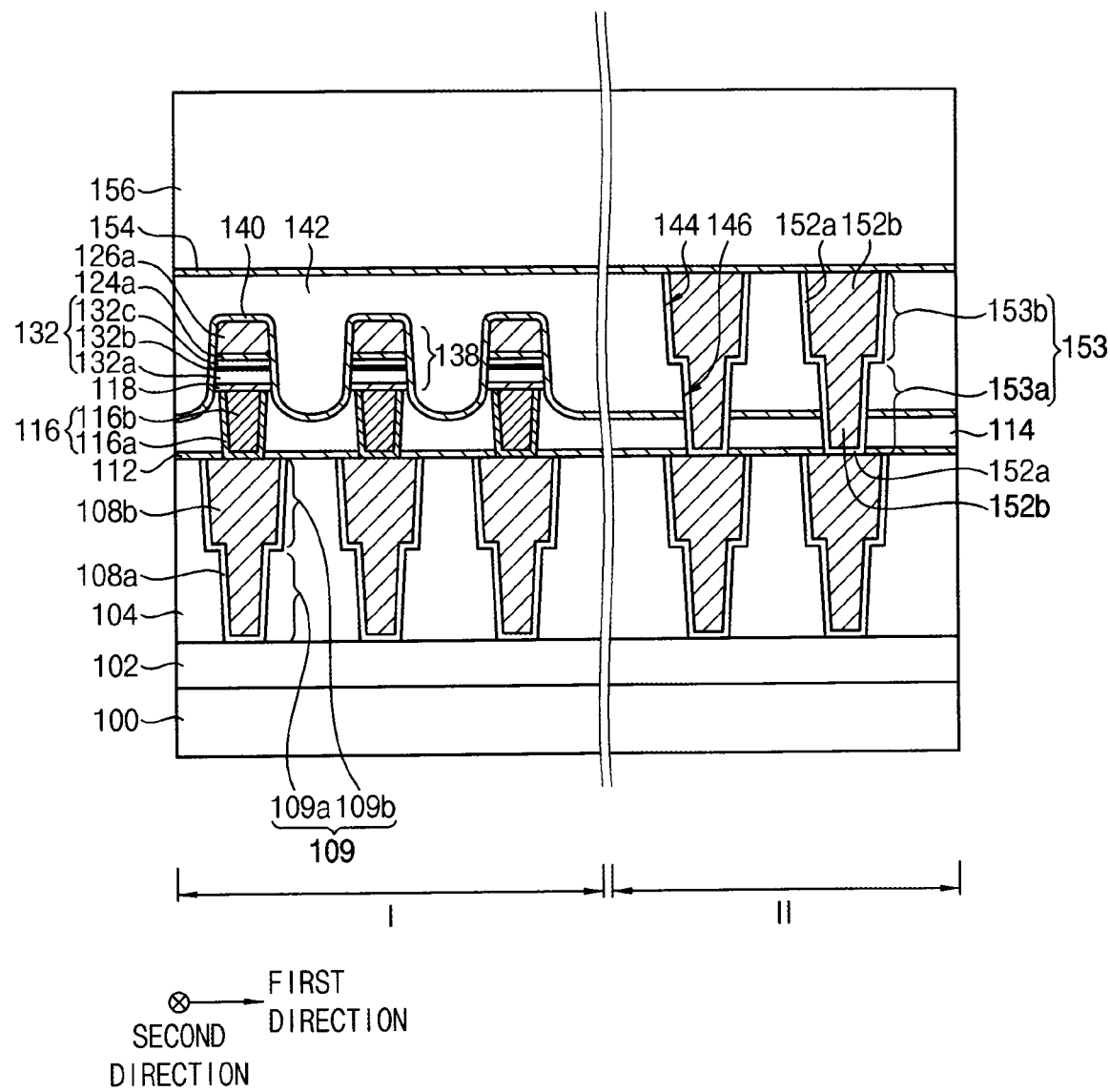

Referring to FIG. 14, the second etch stop layer 154 may be formed on the second mold insulation layer 142 and the first metal wiring 153b. The third mold insulation layer 156 may be formed on the second etch stop layer 154.

Figure 15:
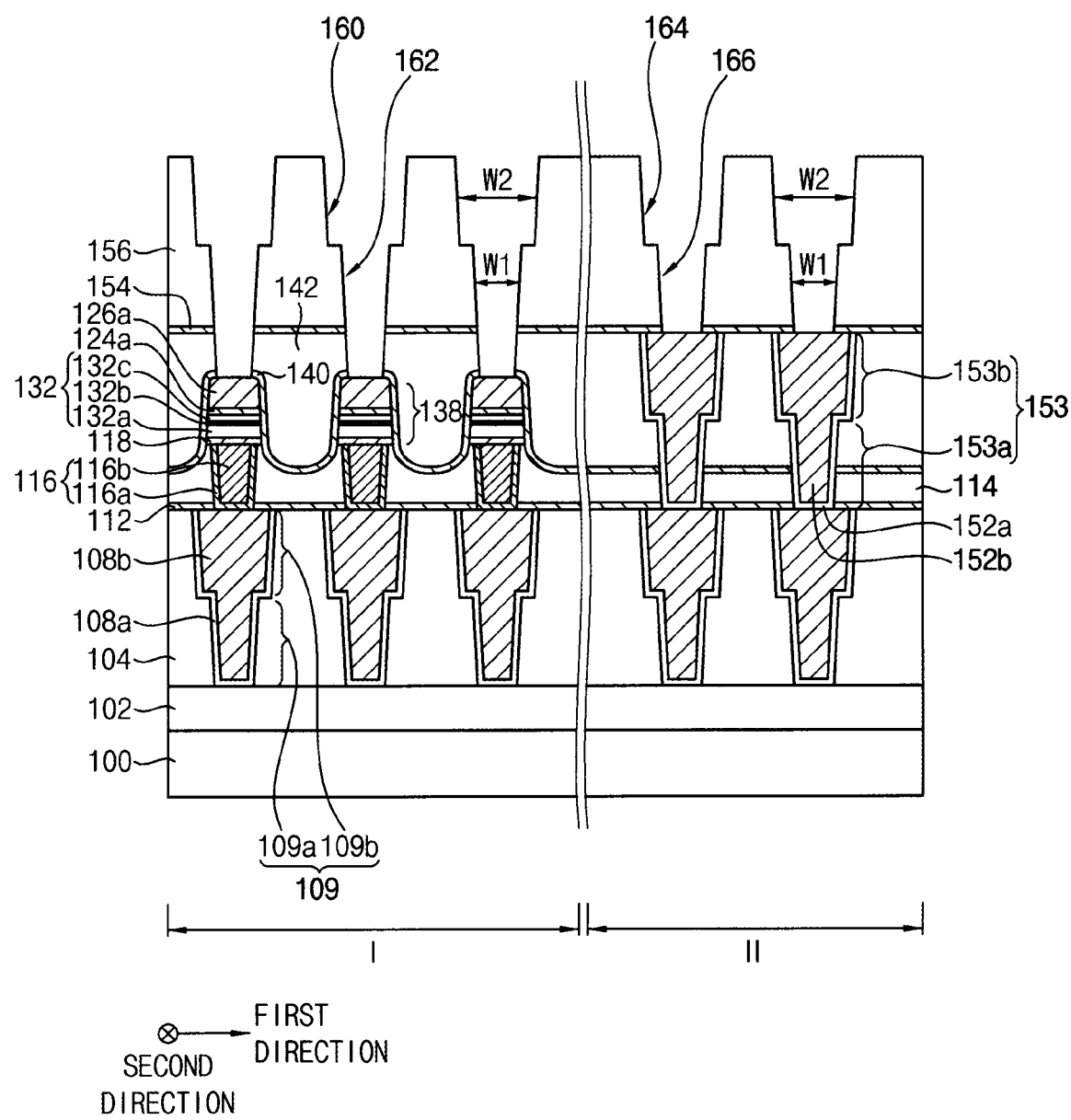
Figure 16:
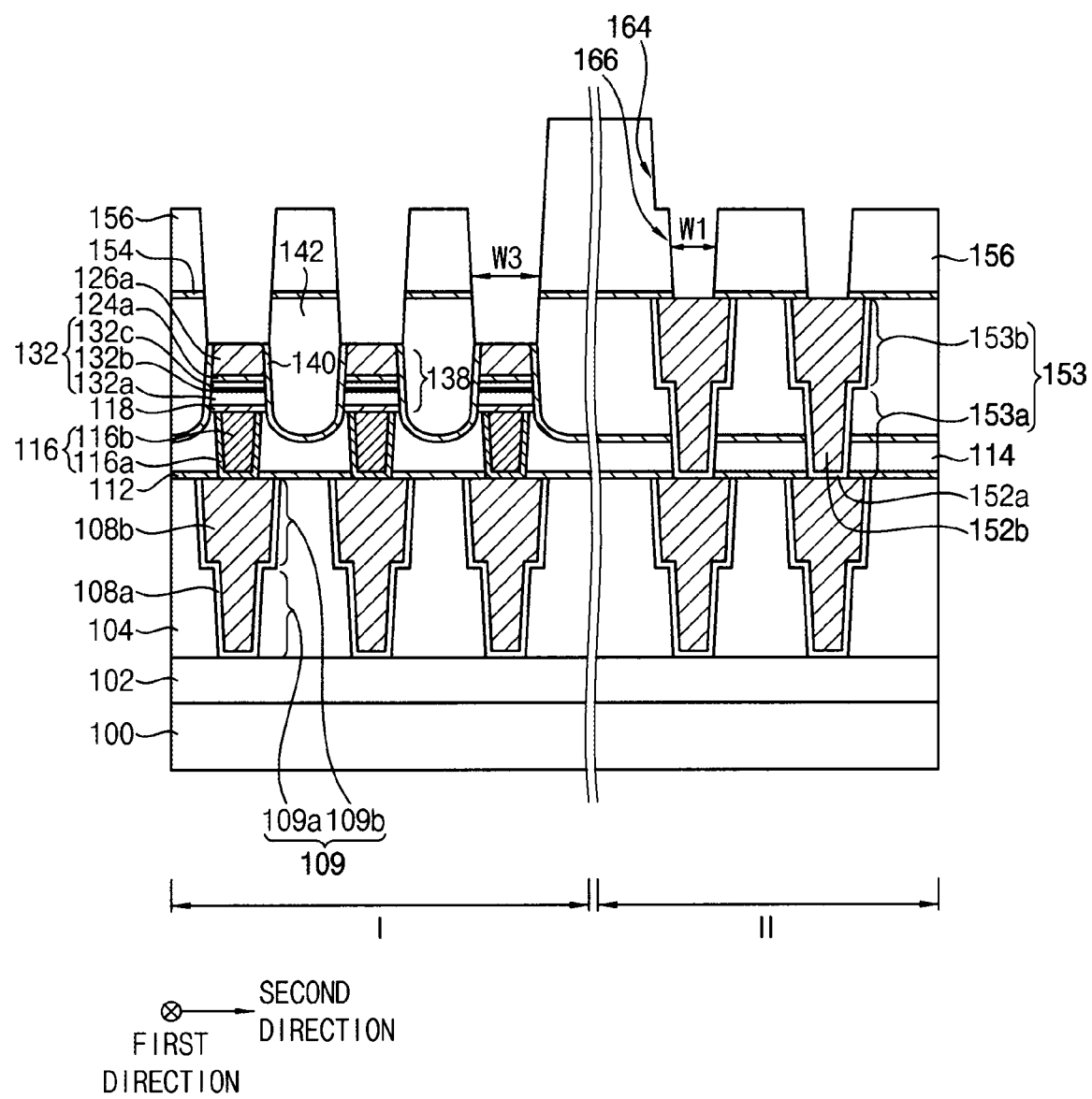

Referring to FIGS. 15 and 16, the third trench 160 may be formed on the third mold insulation layer 156 in the first region I, and the second trench 164 may be formed on the third mold insulation layer 156 in the second region II. The bit line contact hole 162 may pass through the third mold insulation layer 156, the second etch stop layer 154, the second mold insulation layer 142, and the capping layer 140 under the third trench 160 in the first region I. The bit line contact hole 162 may expose the upper electrode 126a. Further, the second via hole 166 may pass through the second mold insulation layer 142 and the second etch stop layer 154 under the second trench 164 in the second region II. The second via hole 166 may expose the first metal wiring 153b.

The bit line contact hole 162 may have the first width W1 in the first direction and the third width W3 in the second direction. In a plan view, the bit line contact hole 162 may have an elliptical shape having a width in the second direction greater than a width in the first direction. The second via hole 166 may have the first width W1 in the first and second directions. In the plan view, the second via hole 166 may have a circular shape. A bottom of the bit line contact hole 162 may be lower than a bottom of the second via hole 166.

In example embodiments, an etch mask for forming the bit line contact hole 162 and the second via hole 166 may be formed on the third mold insulation layer 156 in the first and second regions I and II. In the etch mask, an exposed portion for forming the bit line contact hole 162 may be greater than an exposed portion for forming the second via hole 166.

The third mold insulation layer 156, the second etch stop layer 154, the second mold insulation layer 142, and the capping layer 140 may be sequentially etched using the etching mask to form the bit line contact hole 162 exposing the upper electrode 126a in the first region and the second via hole 166 exposing the first metal wiring 153b in the second region II. In the etching process, the first metal wiring 153b may not be etched, so that the second mold insulation layer 142 in the second region II may not be etched. Thus, the bottom of the bit line contact hole 162 may be lower than the bottom of the second via hole 166.

Thereafter, the third mold insulation layer 156 in the first and second regions I and II may be partially etched to form the third trench 160 of the first region I and the second trench 164 of the second region II. The second and third trenches 164 and 160 may extend in the second direction. Each of the second and third trenches 164 and 160 may have the second width W2 in the first direction. The third mold insulation layer 156 may be exposed at the bottoms of the second and third trenches 164 and 160.

As described above, first, the bit line contact hole 162 and the second via hole 166 may be formed, and then the second and third trenches 164 and 160 may be formed. However, the order of the processes may not be limited thereto.

Figure 17:
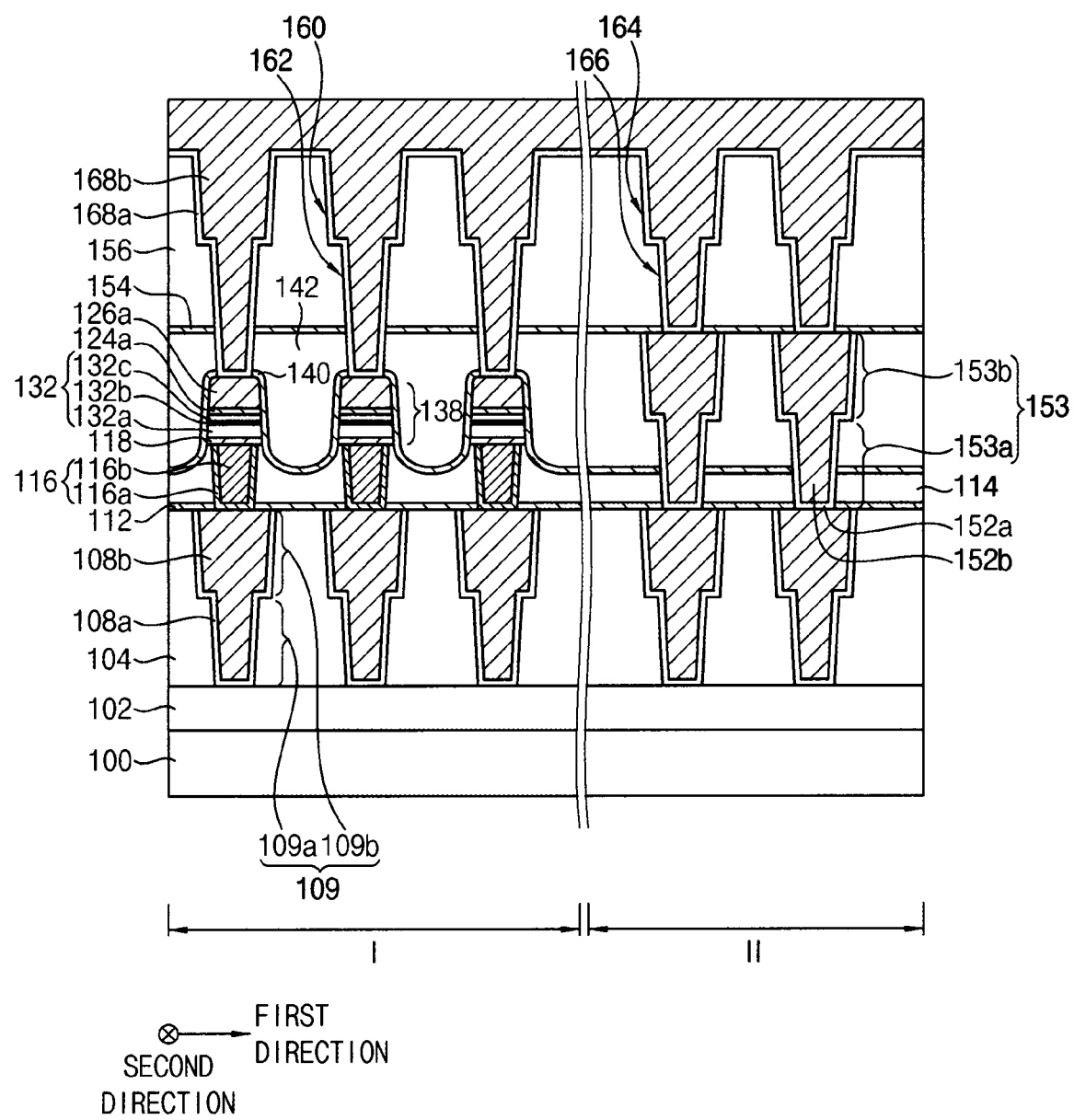
Figure 18:
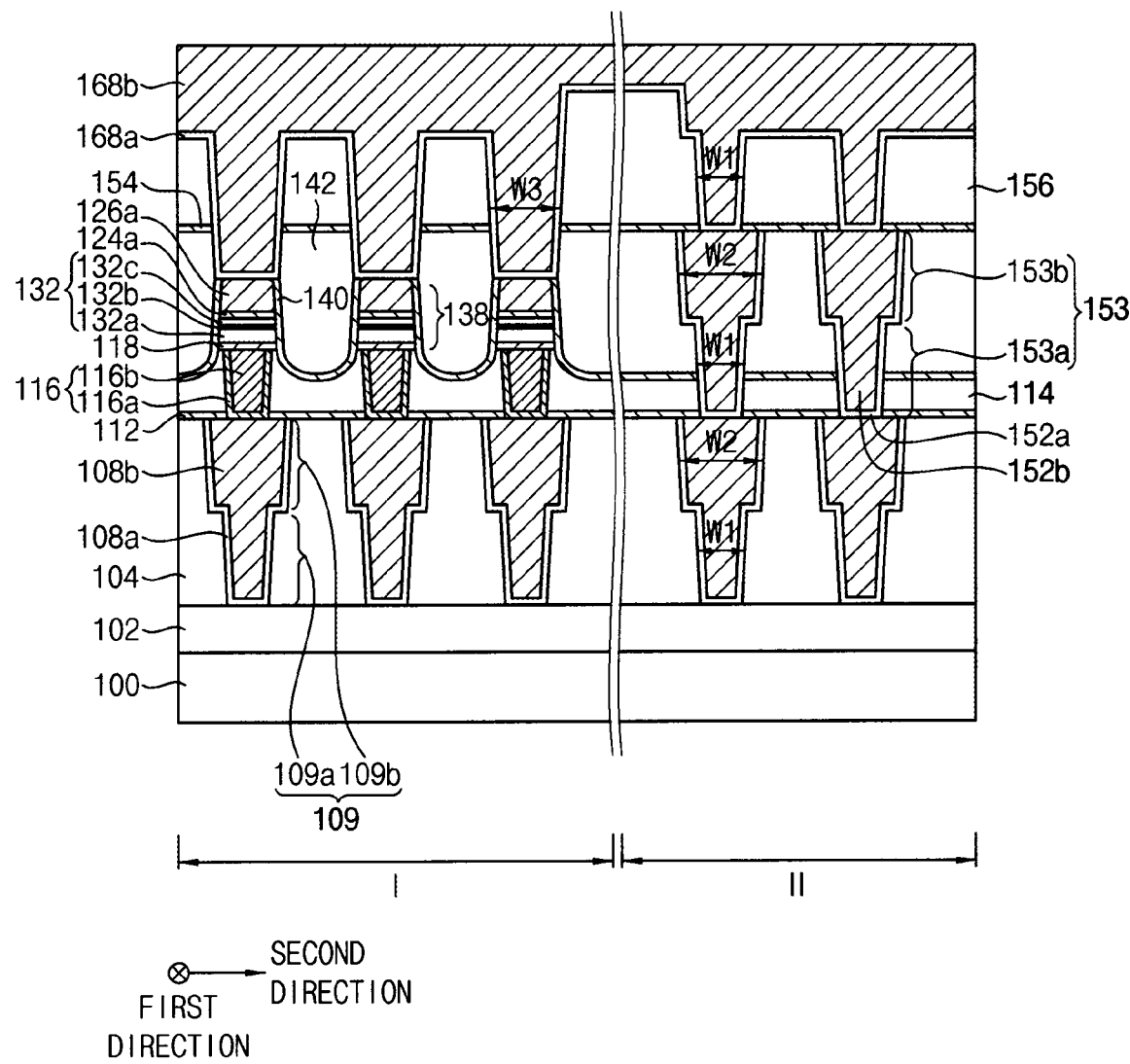

Referring to FIGS. 17 and 18, the third barrier layer 168a may be conformally formed on the third trench 160, the second trench 164, the bit line contact hole 162, the second via hole 166, and an upper surface of the second mold insulation layer 142. The third conductive layer 168b may be formed to fill the third trench 160, the second trench 164, the bit line contact hole 162, and the second via hole 166 on the third barrier layer 168a.

The third conductive layer 168b may include a metal material, e.g., copper. The copper layer may be formed by an electroplating process.

As the bit line contact hole 162 in the first region I has a bottom that is lower than the bottom of the second via hole 166, completely filling the bit line contact hole 162 with the third conductive layer 168b including a metal may be difficult. When the third conductive layer 168b is formed by the same process, the second via hole 166 may be completely filled with the metal. However, the bit line contact hole 162 may not be completely filled with metal, or the metal filling the bit line contact hole 162 may have seams or voids therein. In this case, failures of an operation or reliability in the embedded device may occur.

In contrast, according to example embodiments, as the width in the second direction of the bit line contact hole 162 is increased, an inner volume of the bit line contact hole 162 may be increased. Thus, the metal may be easily filled in the bit line contact hole 162, and the failures of an operation or reliability in the embedded device may be decreased.

Referring to FIGS. 1 and 2 again, the third conductive layer 168b and the third barrier layer 168a may be planarized until the upper surface of the second mold insulation layer 142 may be exposed to form the third barrier pattern 180a and the third conductive pattern 180b in the second trench 164 and the second via hole 166, and the fourth barrier pattern 180c and the fourth conductive pattern 180d in the third trench 160 and the bit line contact hole. The planarization process may include a chemical mechanical polishing process.

By the above process, in the first region I, the bit line contact 182a may be formed in the bit line contact hole 162, and the bit line 182b may be formed in the third trench 160. In the second region II, the second via contact 186a may be formed in the second via hole 166, and the second metal wiring 186b may be formed in the second trench 164. The bit line contact 182a and the bit line 182b may serve as the bit line structure 182, and the second via contact 186a and the second metal wiring 186b may serve as the second metal wiring structure 186.

By the above process, the embedded device may be manufactured. In the embedded device, defects caused by the metal included in the bit line structure 182 may be decreased.

Figure 19:
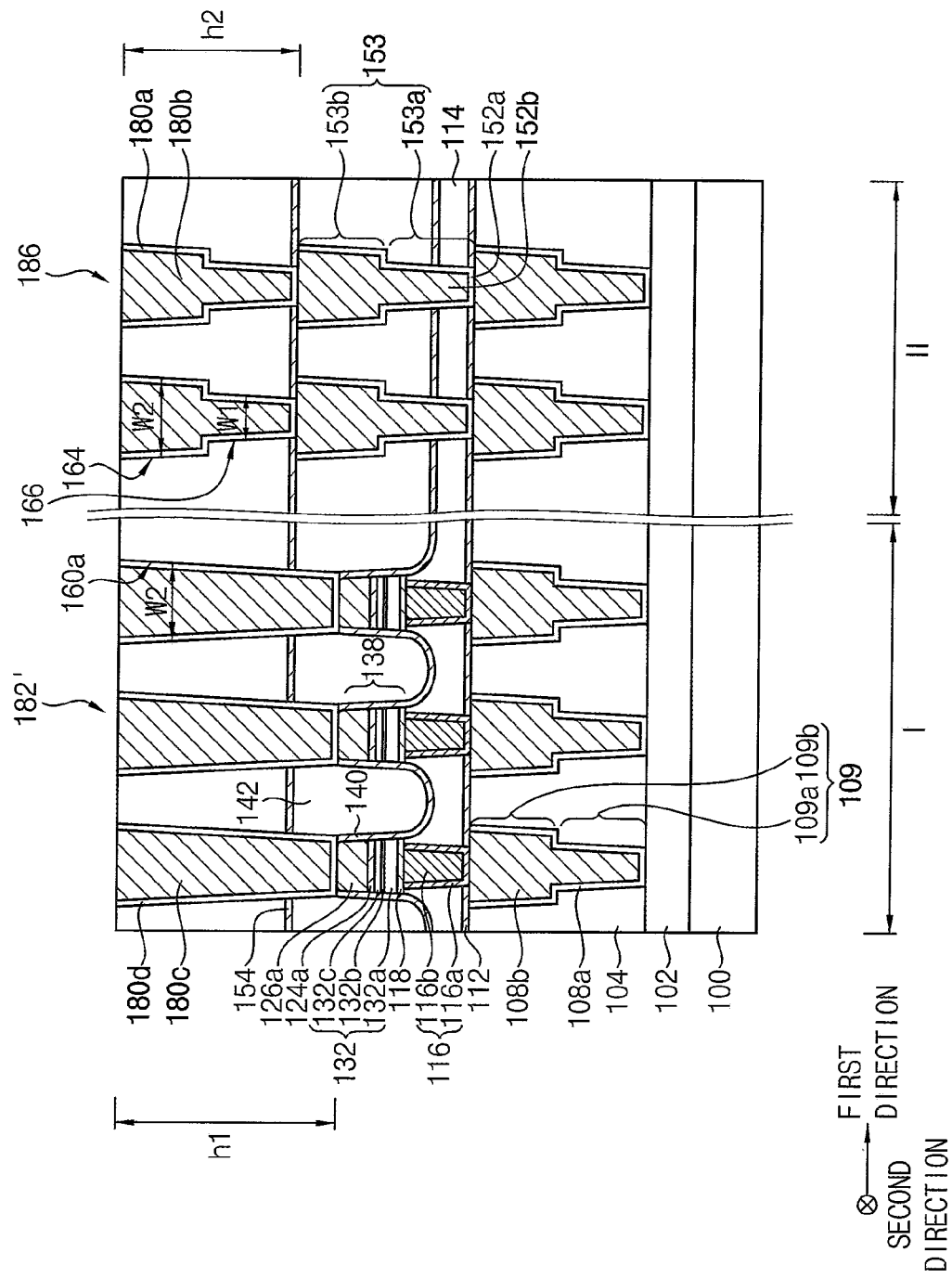
FIGS. 19 and 20 are cross-sectional views illustrating an embedded device in accordance with example embodiments.
Figure 20:
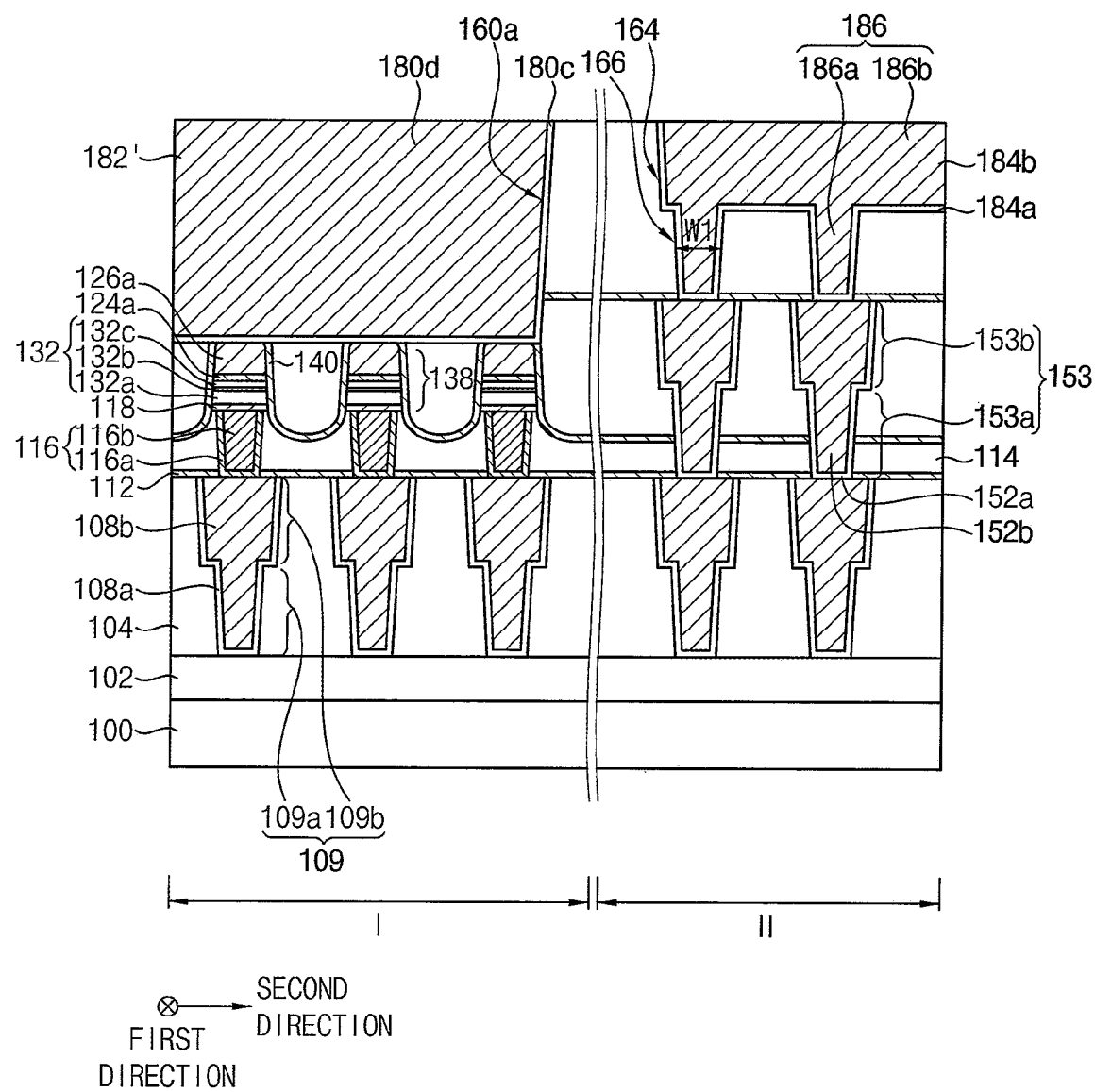
Figure 21:
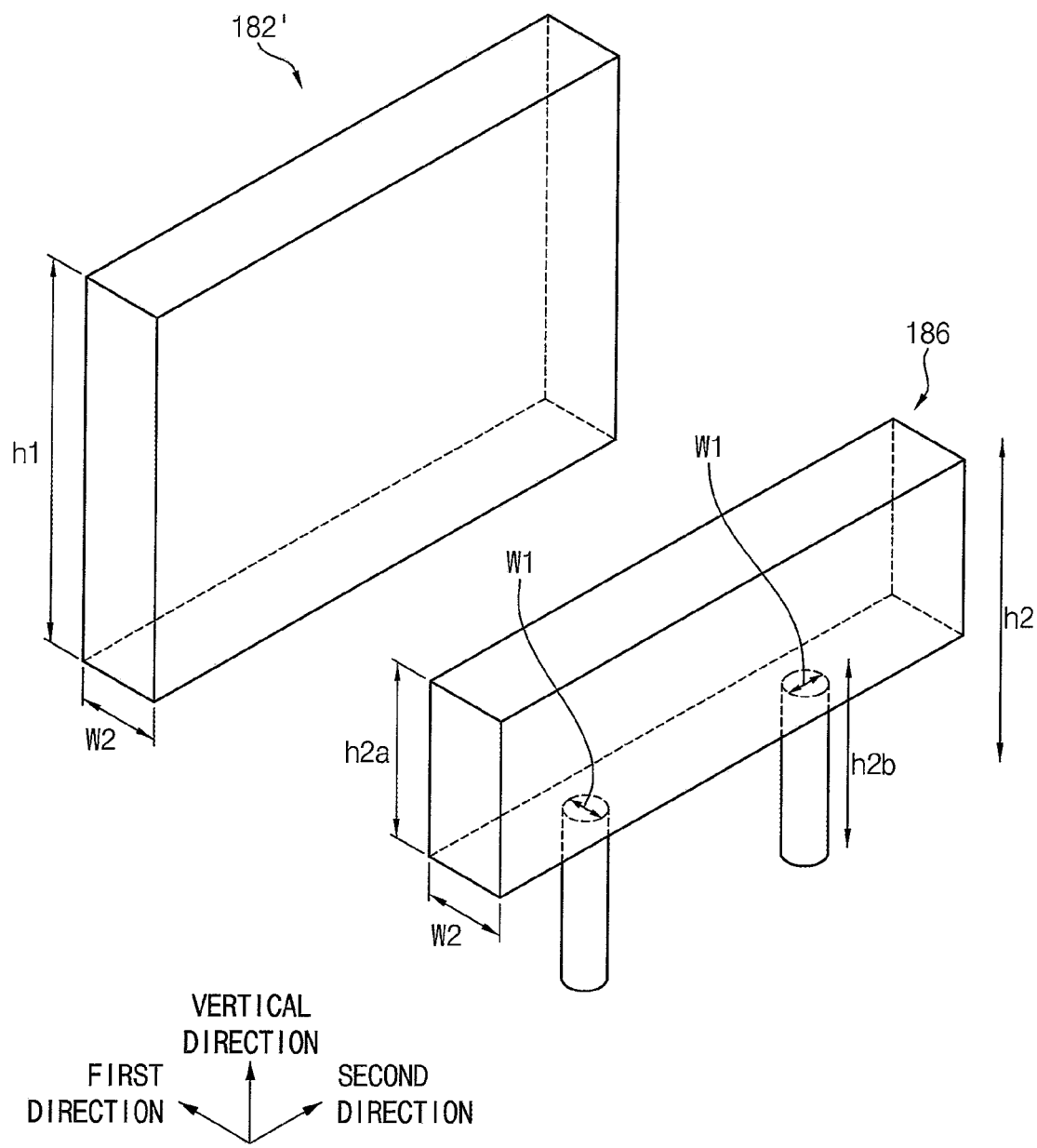
FIG. 21 is a perspective view of a bit line structure and a metal wiring structure in the embedded device of FIGS. 19-20.

FIGS. 19 and 20 are cross-sectional views illustrating an embedded device in accordance with example embodiments. FIG. 21 illustrates perspective views of a bit line structure and a metal wiring structure in the embedded device of FIGS. 19-20.

FIG. 19 is a cross-sectional view cut in the first direction, and FIG. 20 is a cross-sectional view cut in the second direction. The embedded device shown in FIG. 19 may be substantially the same as the embedded device shown in FIGS. 1 and 2, except for a bit line structure. Therefore, the same description is omitted, and the bit line structure is mainly described.

Referring to FIGS. 19 to 21, a third trench 160a may pass through the third mold insulation layer 156, the second etch stop layer 154, the second mold insulation layer 142, and the capping layer 140 in the first region I. The third trench 160a may expose the upper electrode 126a. That is, a bit line contact hole in communication with the third trench 160a may not be formed.

The third trench 160a may have the second width W2 in the first direction. That is, the third trench 160a may have a substantially same width as the width of the second trench 164 at the same level in the second region II. The third trench 160a may extend in the second direction.

A fourth barrier pattern 180c and a fourth conductive pattern 180d may be formed in the third trench 160a. The fourth barrier pattern 180c and the fourth conductive pattern 180d formed in the third trench 160a may serve as a bit line 182'. For example, as illustrated in FIG. 21, the bit line 182' may have a rectangular prism shape with a longitudinal direction along the second direction, the second width W2 along the first direction, and a first height h1 along the vertical direction. The lower surface of the bit line 182' may directly contact the upper electrode 126a, as illustrated in FIG. 20. The bit line 182' may extend in the second direction.

In this case, the bit line 182' may serve as a bit line structure, and thus the bit line and the bit line structure may be used as the same reference numeral. As the bit line structure 182' in the first region I and the second metal wiring structure 186 in the second region II at the same level may be formed by the same process, the bit line structure 182 and the second metal wiring structure 186 may include the same material.

The bit line structure 182' may have a shape different from a shape of the second metal wiring structure 186 when viewed at the same level. Particularly, the first height h1 of the bit line structure 182' may be higher than a second height h2 of the second metal wiring structure 186. The bit line structure 182' may have the second width W2 in the first direction greater than a width of the second via contact 186a of the second metal wiring structure 186. That is, the width in the first direction of the bit line structure 182' may be substantially the same as a width in the first direction of the second metal wiring 186b of the second metal wiring structure 186.

As described above, the width of the bit line structure 182' may be expanded. Therefore, when the bit line structure 182' and the second via contact 186a and the second metal wiring 186b are simultaneously formed, a metal material may be easily filled in the third trench 160a for forming the bit line structure 182'. Thus, defects of the bit line structure 182' may be decreased.

Figure 22:
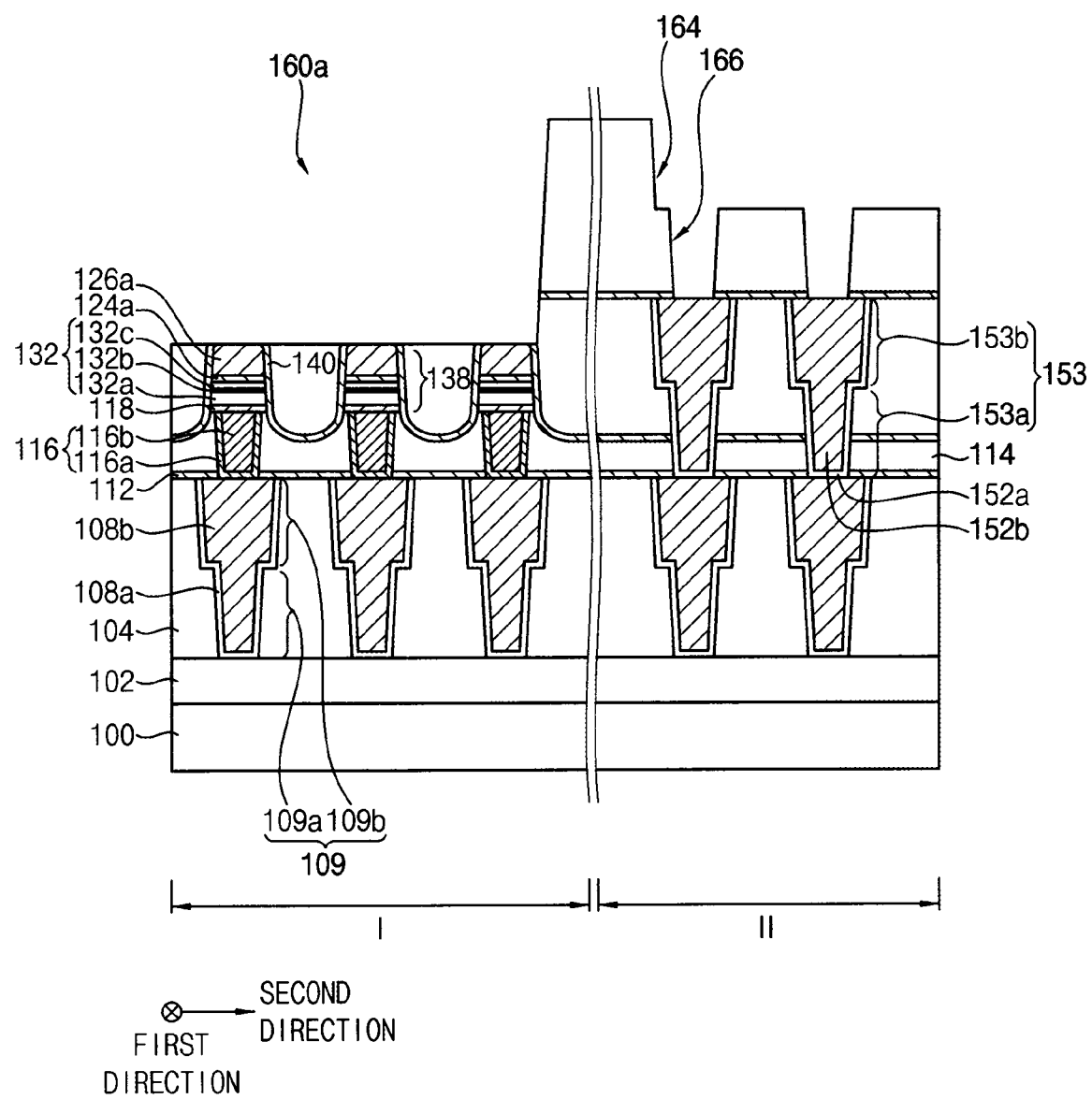
FIGS. 22 and 23 are cross-sectional views illustrating stages in a method of manufacturing an embedded device in accordance with example embodiments.
Figure 23:
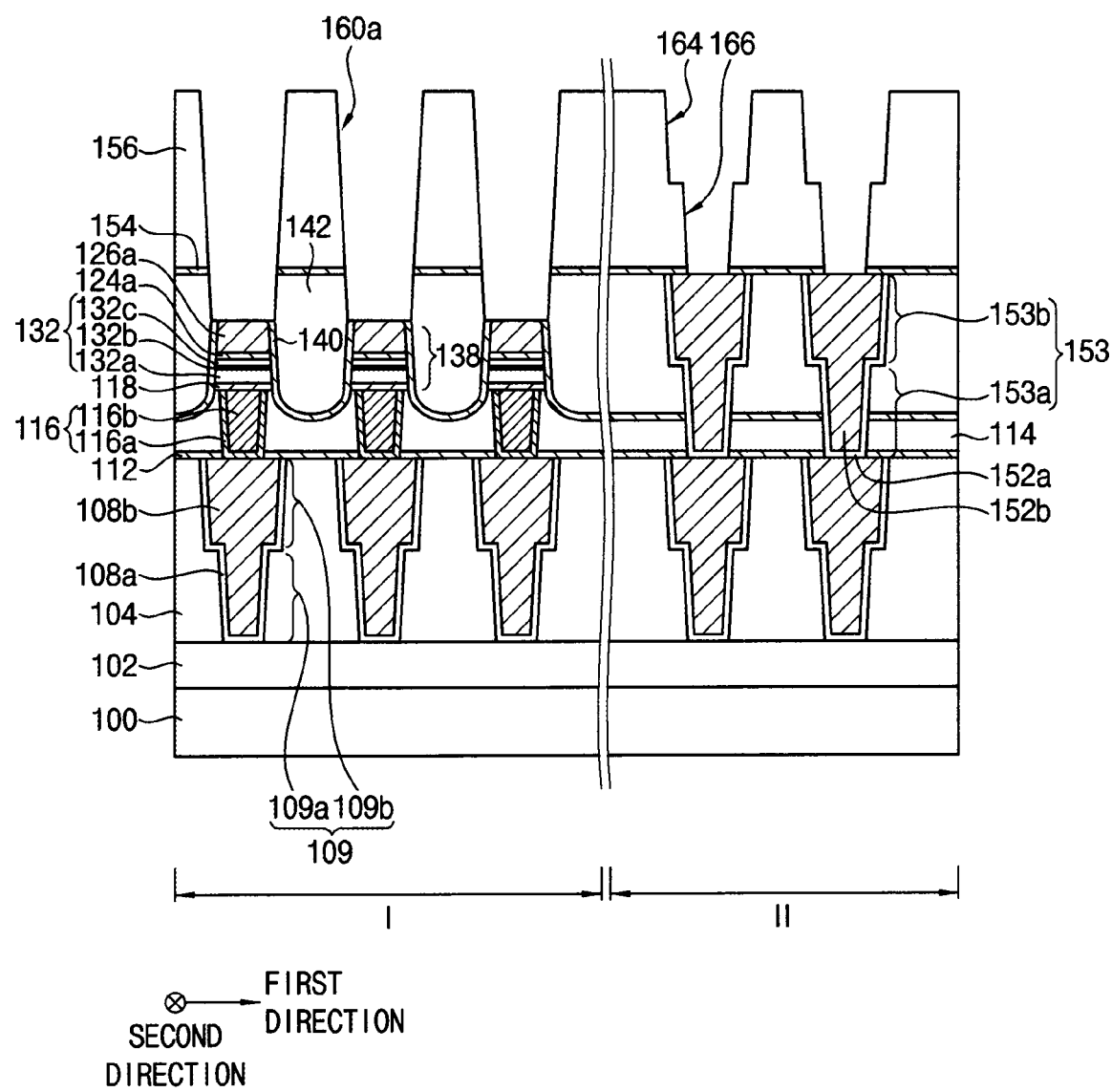

FIGS. 22 and 23 are cross-sectional views illustrating stages in a method of manufacturing an embedded device in accordance with example embodiments.

First, the processes as illustrated with reference to FIGS. 6 to 14 may be performed. Thereafter, referring to FIGS. 22 and 23, the third trench 160a may be formed through the third mold insulation layer 156, the second etch stop layer 154, and the second mold insulation layer 142 and the capping layer 140 in the first region. The second trench 164 may be formed on the third mold insulation layer 156 in the second region II. The second via hole 166 may be formed through the second mold insulation layer 142 and the second etch stop layer 154 below the second trench 164 in the second region II to expose the first metal wiring 153b. The second etch stop layer 154 may also serve as a barrier layer of diffusion of metal.

The second trench 164 and the third trench 160a may have the second width W2 in the first direction. A bottom of the third trench 160a may be lower than a bottom of the second via hole 166.

In example embodiments, an etch mask for forming the third trench 160a and the second via hole 166 may be formed on the third mold insulation layer 156 in the first and second regions I and II. An exposed portion of the etching mask in the first region I may extend in the second direction, and an upper surface of an exposed portion of the etching mask in the second region II may have a circular shape.

The third mold insulation layer 156, the second etch stop layer 154, the second mold insulation layer 142, and the capping layer 140 may be sequentially etched using the etching mask to form the third trench 160a in the first region and the second via hole 166 in the second region. The third trench 160a may expose the upper electrode 126a, and the second via hole 166 may expose the first metal wiring 153b. In the etching process, the first metal wiring 153b may not be etched, so that the second mold insulation layer 142 in the second region II may not be etched. Thus, a bottom of the third trench 160a may be lower than a bottom of the second via hole 166.

Thereafter, an upper portion of the third mold insulation layer 156 in the second region II may be etched to form a second trench 164 being communicated with the second via hole 166 in the second region II. The second and third trenches 164 and 160a may extend in the second direction. Each of the second and third trenches 164 and 160a may have the second width W2 in the first direction.

Referring to FIGS. 19 and 20 again, a third barrier layer may be conformally formed on surfaces of the third trench 160a, the second trench 164, and the second via hole 166 and an upper surface of the second mold insulation layer 142. A third conductive layer may be formed on the third barrier layer to fill the third trench 160a, the second trench 164, and the second via hole 166.

The bottom of the third trench 160a in the first region I may be lower than the bottom of the second via hole 166. However, the width in the second direction of the third trench 160a may be increased, so that a volume of the third trench may be increased. Thus, a metal may easily fill the third trench 160a. The metal may sufficiently fill the third trench 160a, and thus failures of an operation and/or reliability of the embedded device may be decreased.

Thereafter, the third conductive layer and the third barrier layer may be planarized until an upper surface of the second mold insulation layer 142 may be exposed to form the bit line structure 182' in the third trench 160a, and the second metal wiring structure 186 in the second trench 164 and the second via hole 166. By the above process, the embedded device may be manufactured.

Figure 24:
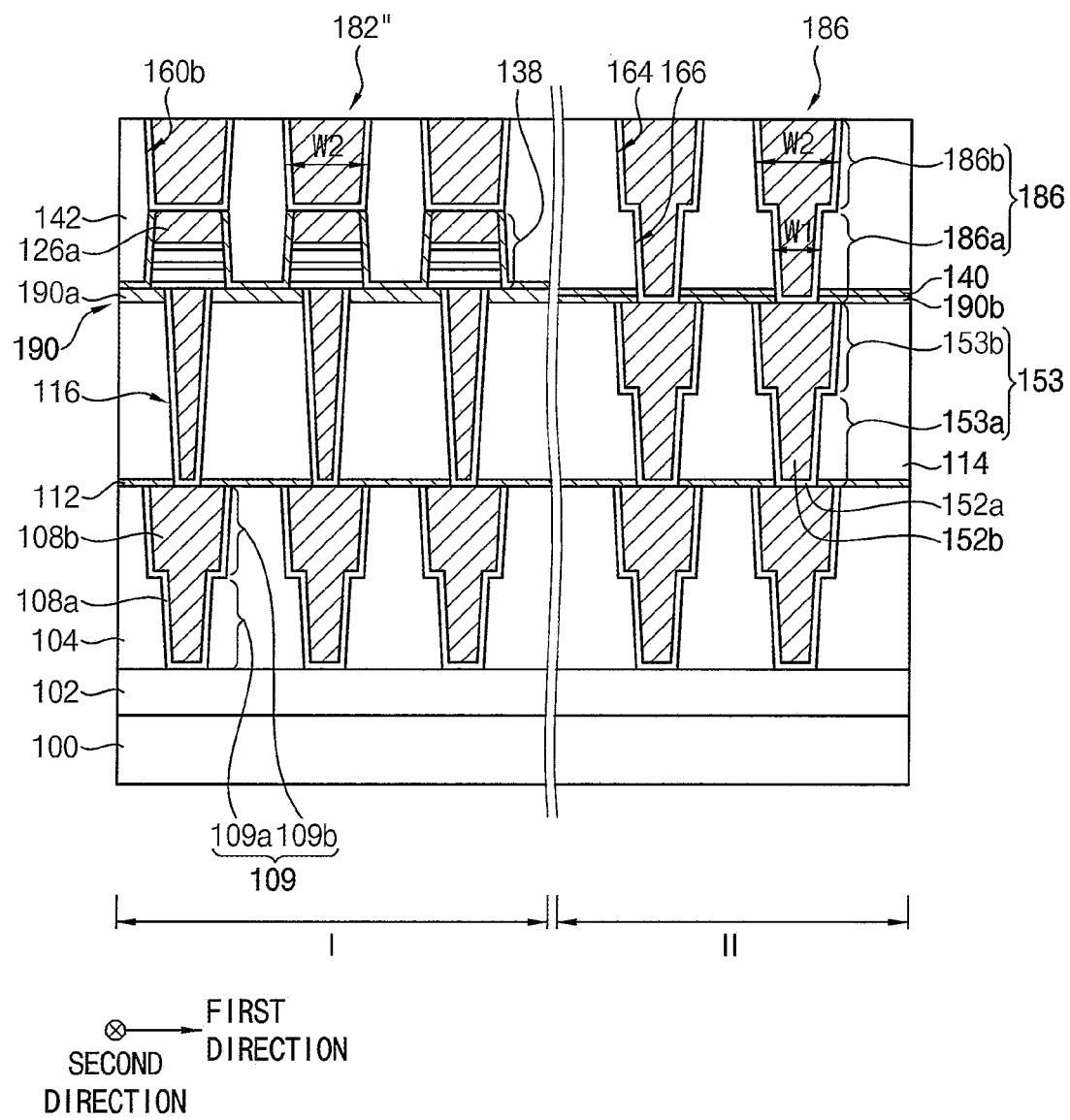
FIG. 24 is a cross-sectional view illustrating an embedded device in accordance with example embodiments.

FIG. 24 is a cross-sectional view illustrating an embedded device in accordance with example embodiments.

The embedded device illustrated in FIG. 24 is the same as the embedded device illustrated in FIGS. 1 and 2 except for the bit line structure 182". Therefore, the same description is omitted, and the bit line structure 182" is mainly described.

Referring to FIG. 24, as illustrated with reference to FIG. 1, the lower insulation layer 102 and the first lower wiring may be formed on the substrate 100 of the first and second regions II. The upper insulation layer 104 may be formed on the lower insulation layer 102. The second lower wiring 109 may be formed in the upper insulation layer 104 in the first and second regions I and II. Further, the first etch stop layer 112 and the first mold insulation layer 114 may be stacked on the upper insulation layer 104 and the second lower wiring 109 in the first region I and the second region II.

The first via contact 153a and the first metal wiring 153b may be formed through the first mold insulation layer 114 and the first etch stop layer 112 in the second region II. The first via contact 153a and the first metal wiring 153b may serve as the first metal wiring structure 153.

The first metal wiring structure 153 may have a shape the same as a shape of the first metal wiring structure as shown in FIG. 1. That is, the first metal wiring 153b may have the second width W2, and the first via contact 153a may have the first width W1. However, unlike shown in FIG. 1, a capping layer may not be formed at sides of the first metal wiring structure 153.

A second etch stop layer 190 may be formed on the first mold insulation layer 114 and the first metal wiring structure 153. In example embodiments, the second etch stop layer 190a in the first region I may have a first thickness, and the second etch stop layer 190b formed in the second region II may have a second thickness less than the first thickness.

A lower electrode contact 116 may be formed through the second etch stop layer 190, the first mold insulation layer 114, and the first etch stop layer 112 in the first region I. That is, a height of the lower electrode contact 116 may be greater than the thickness of the first mold insulation layer 114. Further, an upper surface of the lower electrode contact 116 may be higher than an upper surface of the first metal wiring structure 153.

The first structure 138 may be formed on the lower electrode contact 116. The first structure 138 may be the same as the first structure illustrated with reference to FIG. 1.

The capping layer 140 may be conformally formed on the first structure 138 and the second etch stop layer 154 in the first and second regions I and II. The second mold insulation layer 142 may be formed on the capping layer 140 in the first and second regions I and II. In example embodiments, an upper surface of the second mold insulation layer 142 in the first and second regions I and II may be substantially flat. The second mold insulation layer 142 may have a sufficient height for a metal wiring structure to be disposed in the second mold insulation layer 142. In example embodiments, a thickness of the second mold insulation layer 142 may be in a range of about 500 Å to about 5000 Å.

A third trench 160b may be formed through the upper portion of the second mold insulation layer 142 in the first region I to expose the upper electrode 126a of the first structure 138. The third trench 160b may have the second width W2 in the first direction, and may extend in the second direction.

A fourth barrier pattern and a fourth conductive pattern may be formed in the third trench 160b. A conductive material filling the third trench 160b may serve as the bit line 182". In this case, a bottom of the bit line 182" may directly contact the upper electrode 126a of the first structure 138. The bit line 182" may serve as a bit line structure 182", and a bit line contact may not be formed.

The second trench 164 may pass through the upper portion of the second mold insulation layer 142 in the second region II. The second via hole 166 may be communicated with a bottom of the second trench 164, and may pass through the second mold insulation layer 142, the second etch stop layer 154, and the capping layer 140. The second via hole 166 may expose an upper surface of the first metal wiring 153b.

The second via contact 186a may be formed in the second via hole 166, and a metal material filling the second trench 164 may serve as the second metal wiring 186b. The second via contact 186a and the second metal wiring 186b may serve as the second metal wiring structure 186. The second via contact 186a may contact the first metal wiring 153b, so that the second via contact 186a may be electrically connected to the first metal wiring 153b. The first and second metal wiring structures 153 and 186 may be electrically connected to each other.

The upper surfaces of the second mold insulation layer 142, the second metal wiring structure 186, and the bit line structure 182" may be coplanar with each other. A height of the bit line structure 182" may be less than a height of the second metal wiring structure 186. For example, the height of the bit line structure 182" may be substantially the same as the height of the second metal wiring 186b. Also, a width in the first direction of the bit line structure 182" may be greater than a width in the first direction of the second via contact 186a. The bit line structure 182" may have the second width W2 in the first direction. Therefore, a metal material for forming the bit line structure 182" may be easily filled in the third trench 160b. Thus, defects of the bit line structure 182" may be decreased.

FIGS. 25 to 29 are cross-sectional views illustrating stages in a method of manufacturing an embedded device in accordance with example embodiments.

Figure 25:
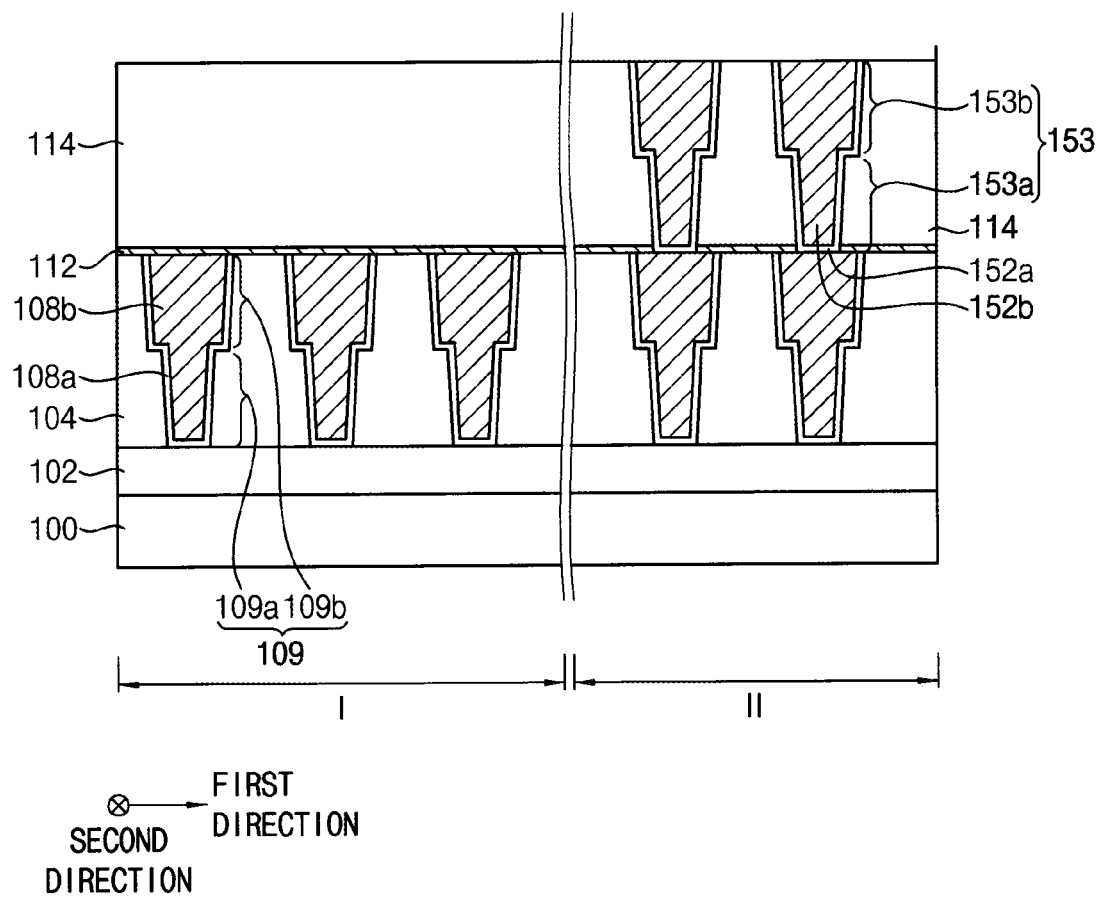
FIGS. 25 to 29 are cross-sectional views illustrating stages in a method of manufacturing an embedded device in accordance with example embodiments.

Referring to FIG. 25, first, processes illustrated with reference to FIG. 6 may be performed. Thereafter, the first mold insulation layer 114 may be formed on the first etch stop layer 112.

A portion of the first mold insulation layer 114 in the second region II may be etched to form a first trench. A via hole being communication with the first trench may be formed to expose the upper surface of the second lower wiring 109.

A first barrier layer and a first conductive layer may be formed in the first trench and the first via hole. Thereafter, the first conductive layer and the first barrier layer may be planarized until an upper surface of the first mold insulation layer 114 may be exposed to form a first barrier pattern and a first conductive pattern in the first trench and the first via hole. By the above process, the first via contact 153a may be formed in the first via hole, and the first metal wiring 153b may be formed in the first trench.

Figure 26:
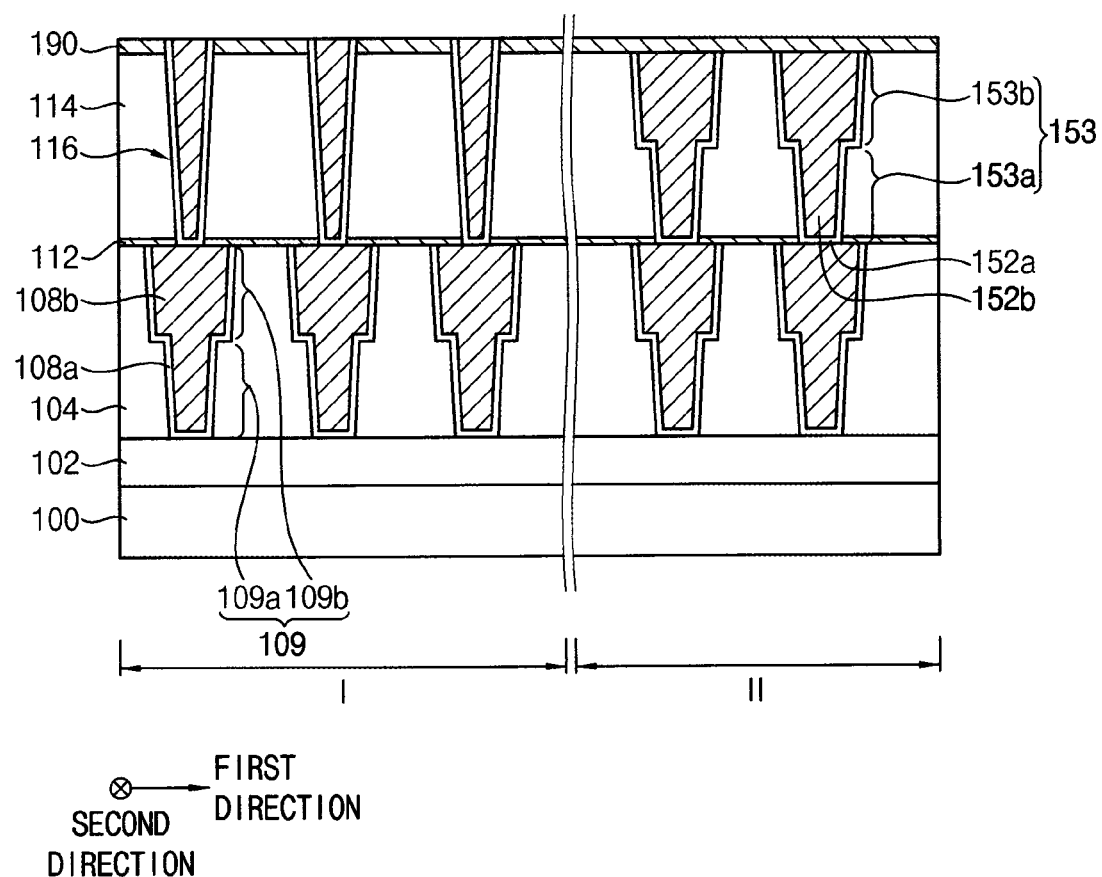

Referring to FIG. 26, the second etch stop layer 190 may be formed on the first mold insulation layer 114 and the first metal wiring 153b. Portions of the second etch stop layer 190, the first mold insulation layer 114, and the first etch stop layer 112 in the first region I may be etched to form a lower electrode contact hole exposing the second lower wiring 109. The lower electrode contact 116 may be formed in the lower electrode contact hole.

Figure 27:
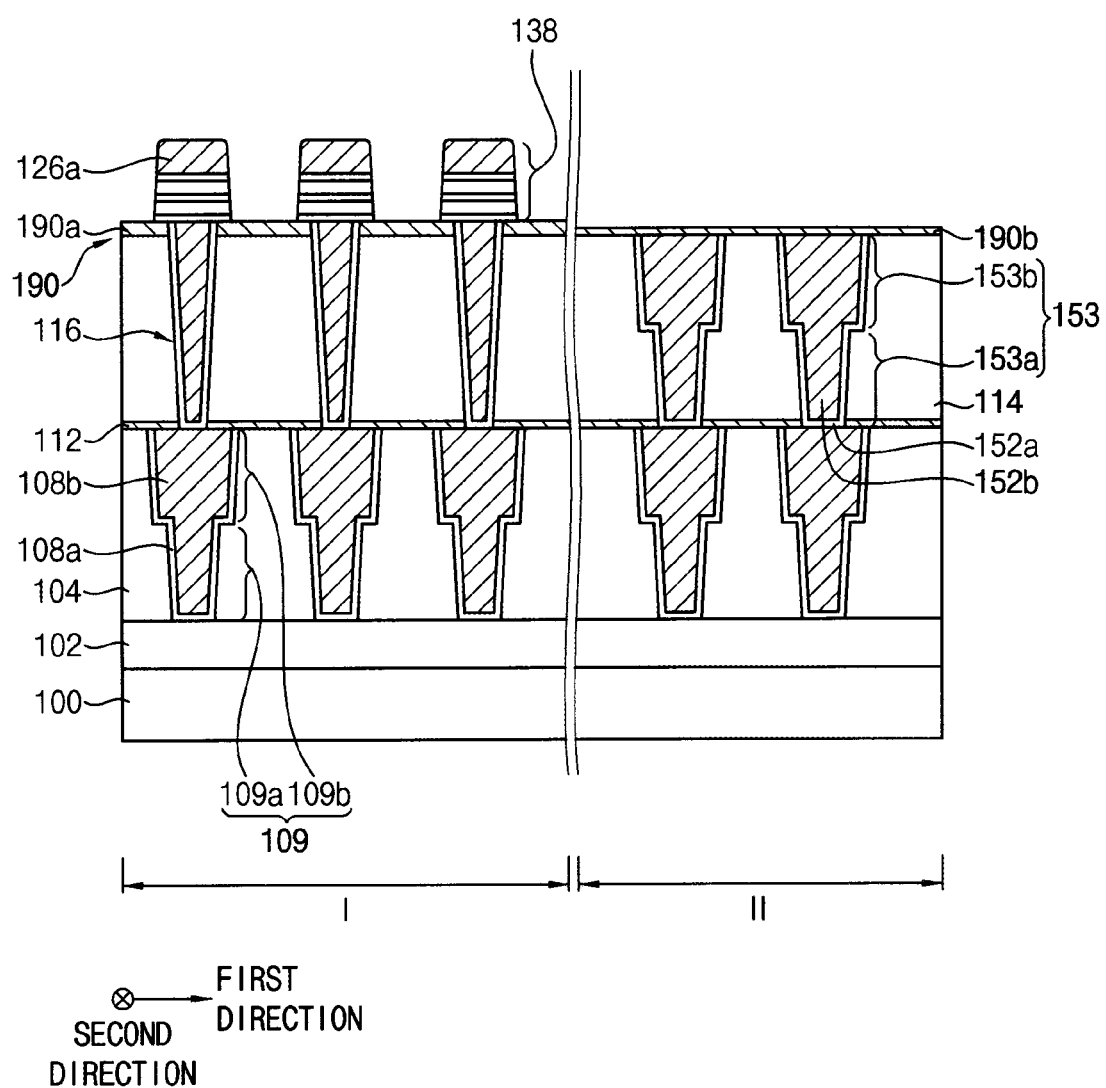

Referring to FIG. 27, a lower electrode layer, an MTJ layer, and a middle electrode layer may be sequentially formed on the first mold insulation layer 114 and the lower electrode contact 116. An upper electrode layer and an adhesive layer may be sequentially formed on the middle electrode layer. Thereafter, a mask pattern may be formed on the adhesive layer, and the middle electrode layer, the MTJ layer, and the lower electrode layer may be sequentially etched using the mask pattern as an etching mask. Thus, the first structure 138 including a stack of the lower electrode, the MTJ structure, the middle electrode, and the upper electrode 126a may be formed on the lower electrode contact 116.

In the etching process, the second etch stop layer 190 may not be completely removed in the first and second regions I and II. Further, the second etch stop layer 190*b* of the second region II may be etched more than the second etch stop layer 190*a* of the first region I.

Figure 28:
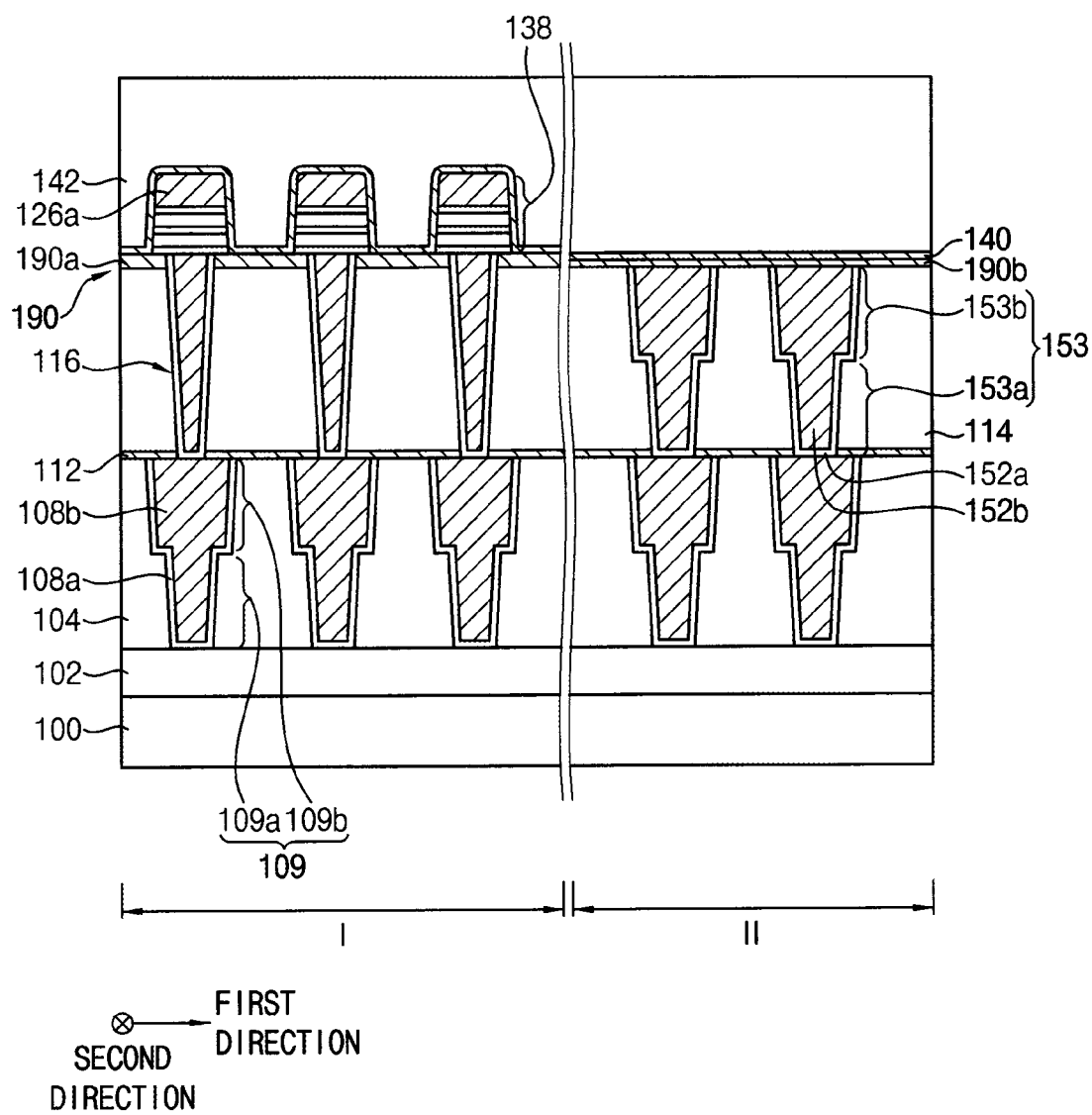

Referring to FIG. 28, the capping layer 140 may be conformally formed on surfaces of the first structure 138 and the first mold insulation layer 114. The second mold insulation layer 142 may be formed on the capping layer 140.

Figure 29:
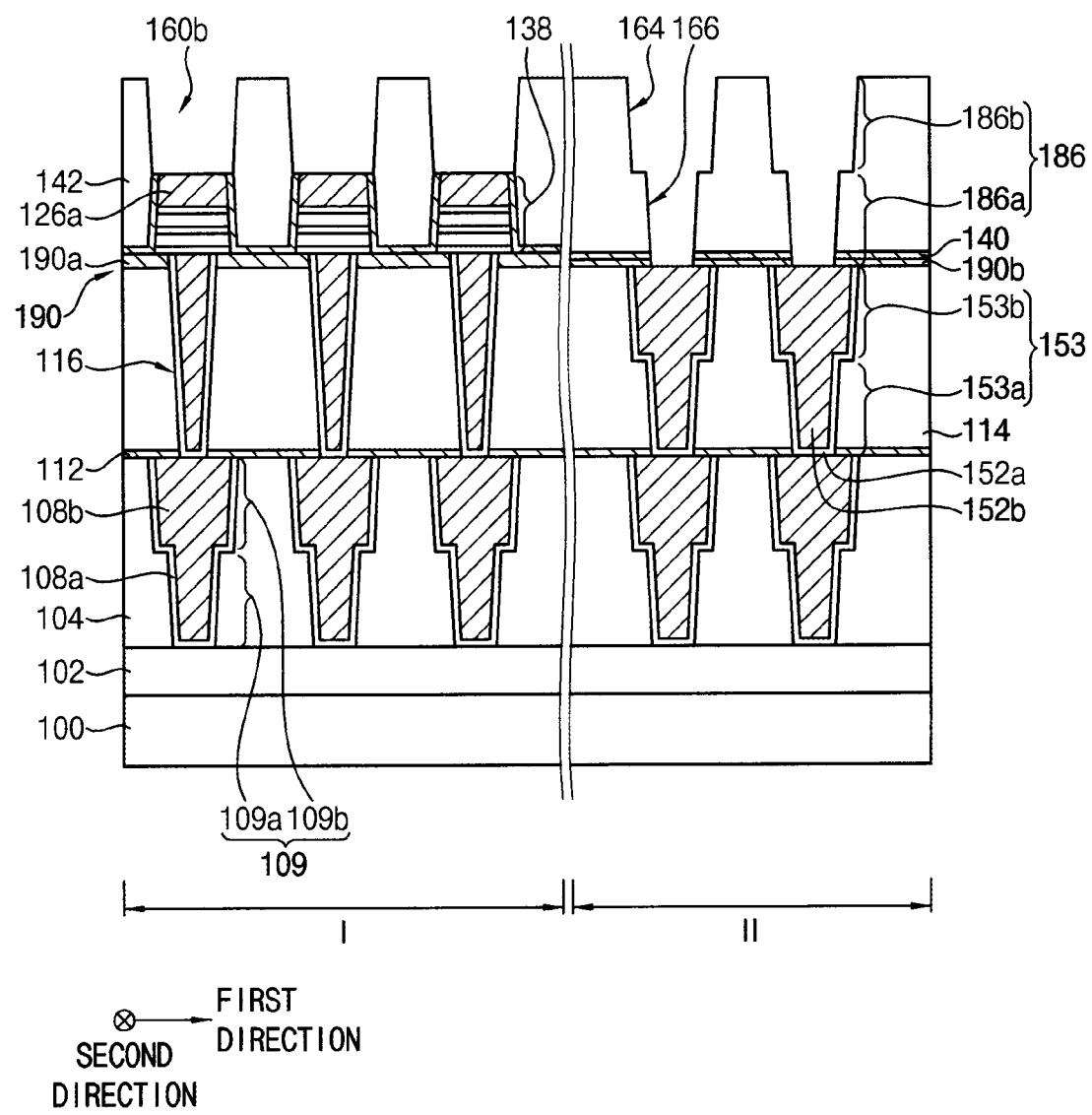

Referring to FIG. 29, the third trench 160*b* exposing the upper electrode 126*a* may be formed through the upper portion of the second mold insulation layer 142 in the first region I. Further, the second trench 164 may be formed through the upper portion of the second mold insulation layer 142 in the second region II. The second via hole 166 may be formed through the second mold insulation layer 142, the capping layer 140, and the second etch stop layer 190 under the second trench. The second via hole 166 may expose the first metal wiring 153*b*.

The second trench 164 and the third trench 160*b* may have the second width W2 in the first direction. A bottom of the third trench 160*b* may be higher than a bottom of the second via hole 166.

Referring again to FIG. 24, a third barrier layer may be conformally formed on surfaces of the third trench 160*b*, the second trench 164, the second via hole 166 and the second mold insulation layer 142. A third conductive layer may be formed on the third barrier layer to fill the third trench 160*b*, the second trench 164 and the second via hole 166. Thereafter, the third barrier layer and the third conductive layer may be planarized until an upper surface of the second mold insulation layer 142 may be exposed. Thus, the bit line structure 182" may be formed in the third trench 160*b*, and the second metal wiring structure 186 may be formed in the second trench 164 and the second via hole 166. By the above process, the embedded device may be manufactured.

The embedded device of each of embodiments may be used in electronic products, e.g., mobile devices, memory cards, and computers.

By way of summation and review, example embodiments provide an embedded device having high reliability and excellent electrical characteristics. According to embodiments, in the embedded device, defects caused by not sufficiently filling a metal at a lower portion of the bit line structure may be decreased. The embedded device may have a high degree of freedom in a design of layout. Further, the embedded device may have high reliability and excellent electrical characteristics.

That is, according to embodiments, a bit line structure may be stacked on a MTJ module to be within a height of two unit wirings formed adjacently and simultaneously, with a height of the bit line structure being larger than a height of an adjacent unit wiring at the same level. Therefore, when a metal wiring of the bit line structure is formed, a lower portion of the bit line structure may have a greater width and volume than those of the adjacent unit wiring at the same level, thereby facilitating metal filling and defect prevention.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An embedded device, comprising:
a first mold insulation layer on a substrate, the substrate including a first region and a second region;
a second mold insulation layer on the first mold insulation layer;
a lower electrode contact in the first mold insulation layer, the lower electrode contact being on the first region of the substrate;
a first structure in the second mold insulation layer and contacting an upper surface of the lower electrode contact, the first structure including a stack of a lower electrode, a magnetic tunnel junction (MTJ) structure, and an upper electrode;
a first metal wiring structure passing through the first and second mold insulation layers in the second region of the substrate;
a third mold insulation layer on the second mold insulation layer;
a bit line structure passing through the third mold insulation layer and an upper portion of the second mold insulation layer in the first region, the bit line structure having a first height in a vertical direction and contacting the upper electrode of the first structure; and
a second metal wiring structure passing through the third mold insulation layer in the second region, the second metal wiring structure contacting the first metal wiring structure, and the second metal wiring structure having a second height in the vertical direction that is lower than the first height of the bit line structure,
wherein the bit line structure includes a bit line contact and a bit line, and
wherein the second metal wiring structure includes a second via contact and a second metal wiring, the second via contact having a width along a longitudinal direction of the second metal wiring that is shorter than a width of the bit line contact along a longitudinal direction of the bit line.

2. The embedded device as claimed in claim 1, wherein the bit line structure has a shape different from a shape of the second metal wiring structure.

3. The embedded device as claimed in claim 1, wherein the bit line contact has a shape different from a shape of the second via contact.

4. The embedded device as claimed in claim 3, wherein:
an upper surface of the second via contact has a circular shape having a first width in each of first and second directions perpendicular to each other, and
an upper surface of the bit line contact has an elliptical shape having the first width in the first direction and a third width in the second direction, the third width being greater than the first width, and the longitudinal directions of the second metal wiring and the bit line extending in the second direction.

5. The embedded device as claimed in claim 3, wherein a height in the vertical direction of the bit line contact is higher than a height in the vertical direction of the second via contact.

6. The embedded device as claimed in claim 1, wherein the bit line directly contacts the upper electrode and extends lengthwise in a second direction.

7. The embedded device as claimed in claim 6, wherein the second via contact has a first width in a first direction perpendicular to the second direction, and the bit line structure has a second width in the first direction greater than the first width.

8. The embedded device as claimed in claim 7, wherein the second width in the first direction of the bit line structure is the same as a width in the first direction of the second metal wiring.

9. The embedded device as claimed in claim 8, wherein a bottom of the bit line structure is lower than a bottom of the second metal wiring structure.

10. The embedded device as claimed in claim 1, wherein the second mold insulation layer is on a top surface of the first structure, and a thickness from the top surface of the first structure to an upper surface of the second mold insulation layer is in a range of 100 Å to 800 Å.

11. The embedded device as claimed in claim 1, wherein the first height is higher than the second height by 100 Å to 800 Å.

12. The embedded device as claimed in claim 1, wherein the second height is in a range of 500 Å to 5000 Å.

13. An embedded device, comprising:
a first mold insulation layer on a substrate, the substrate including a first region and a second region;
a second mold insulation layer on the first mold insulation layer;
a lower electrode contact in the first mold insulation layer in the first region;
a first structure in the second mold insulation layer in the first region, the first structure contacting an upper surface of the lower electrode contact, and the first structure including a lower electrode, a magnetic tunnel junction (MTJ) structure, and an upper electrode stacked;
a first metal wiring structure passing through the first and second mold insulation layers in the second region;
a third mold insulation layer on the second mold insulation layer;
a bit line structure passing through the third mold insulation layer and through an upper portion of the second mold insulation layer in the first region, the bit line structure contacting the upper electrode of the first structure, and the bit line structure including a bit line contact and a bit line; and
a second metal wiring structure passing through the third mold insulation layer in the second region, the second metal wiring structure contacting the first metal wiring structure, and the second metal wiring structure including a second via contact and a second metal wiring,
wherein the second via contact of the second metal wiring has a width along a longitudinal direction of the second metal wiring that is shorter than a width of the bit line contact along a longitudinal direction of the bit line,
wherein a height in a vertical direction of the bit line structure is different from a height in the vertical direction of the second metal wiring structure, and
wherein a shape of the bit line structure is different from a shape of the second metal wiring structure.

14. The embedded device as claimed in claim 13, wherein:
a height in the vertical direction of the bit line contact is higher than a height in the vertical direction of the second via contact.

15. The embedded device as claimed in claim 14, wherein:
an upper surface of the second via contact has a circular shape having a first width in each of first and second directions perpendicular to each other, and
an upper surface of the bit line contact has an elliptical shape having the first width in the first direction and a third width in the second direction, the third width being greater than the first width, and the longitudinal directions of the second metal wiring and the bit line extending in the second direction.

16. The embedded device as claimed in claim 14, wherein the second metal wiring structure has a second height in the vertical direction, and the bit line structure has a first height in the vertical direction higher than the second height.

17. The embedded device as claimed in claim 13, wherein the bit line directly contacts the upper electrode and extends lengthwise in a second direction.

18. The embedded device as claimed in claim 17, wherein the second via contact has a first width in a first direction perpendicular to the second direction, and the bit line structure has a second width in the first direction greater than the first width.

19. An embedded device, comprising:
a substrate including a first region and a second region;
a lower electrode contact on the substrate in the first region;
a first structure contacting an upper surface of the lower electrode contact, the first structure including a lower electrode, a magnetic tunnel junction (MTJ) structure, and an upper electrode stacked;
a first metal wiring structure on the substrate in the second region, an upper surface of the first metal wiring structure being higher than an upper surface of the first structure;
a bit line structure contacting the upper electrode of the first structure, the bit line structure including a bit line contact and a bit line; and
a second metal wiring structure contacting the first metal wiring structure, the second metal wiring structure including a second via contact and a second metal wiring,
wherein a height in a vertical direction of the bit line structure is different from a height in the vertical direction of the second metal wiring structure, and
wherein the second via contact of the second metal wiring structure has a width along a longitudinal direction of the second metal wiring that is shorter than a width of the bit line contact along a longitudinal direction of the bit line.

20. The embedded device as claimed in claim 19, wherein the height in the vertical direction of the bit line structure is higher than the height in the vertical direction of the second metal wiring structure by 100 Å to 800 Å.

* * * * *